United States Patent [19]

Daughton

[11] Patent Number: 5,617,071
[45] Date of Patent: Apr. 1, 1997

[54] MAGNETORESISTIVE STRUCTURE COMPRISING FERROMAGNETIC THIN FILMS AND INTERMEDIATE ALLOY LAYER HAVING MAGNETIC CONCENTRATOR AND SHIELDING PERMEABLE MASSES

[75] Inventor: James M. Daughton, Edina, Minn.

[73] Assignee: Nonvolatile Electronics, Incorporated, Eden Prairie, Minn.

[21] Appl. No.: 384,647

[22] Filed: Feb. 6, 1995

Related U.S. Application Data

[63] Continuation-in-part of Ser. No. 182,614, Jan. 18, 1994, which is a continuation-in-part of Ser. No. 976,905, Nov. 16, 1992, abandoned.

[51] Int. Cl.⁶ .................................................. H01L 43/00
[52] U.S. Cl. ............................... 338/32 R; 324/207.21; 324/252
[58] Field of Search ............................. 338/32 R, 324, 338/325; 365/158, 173; 360/113, 126; 324/207.21, 252; 428/611

[56] References Cited

U.S. PATENT DOCUMENTS

| | | | |
|---|---|---|---|
| 3,545,579 | 12/1970 | Paul et al. | 324/46 |
| 4,403,187 | 9/1983 | Takahashi et al. | 338/32 R |
| 4,807,073 | 2/1989 | Takeura et al. | 338/32 R |
| 4,835,510 | 5/1989 | Shibasaki et al. | 338/32 R |
| 4,949,039 | 7/1990 | Grünberg | 324/252 |
| 5,038,130 | 8/1991 | Eck et al. | 338/32 H |
| 5,119,025 | 6/1992 | Smith et al. | 324/252 |
| 5,134,533 | 7/1992 | Friedrich et al. | 360/113 |
| 5,157,570 | 10/1992 | Shukovsky et al. | 360/126 |
| 5,159,513 | 10/1992 | Dieny et al. | 360/113 |
| 5,189,367 | 2/1993 | Lee et al. | 338/32 R |
| 5,198,795 | 3/1993 | Shibasaki et al. | 338/32 H |
| 5,206,590 | 4/1993 | Dieny et al. | 324/252 |
| 5,227,761 | 7/1993 | Sugimoto et al. | 338/32 R |
| 5,243,316 | 9/1993 | Sakakima et al. | 338/32 R |
| 5,247,278 | 9/1993 | Pant et al. | 338/32 R |
| 5,260,653 | 11/1993 | Smith et al. | 324/252 |
| 5,287,238 | 2/1994 | Baumgart et al. | 360/113 |
| 5,366,815 | 11/1994 | Araki et al. | 428/611 |
| 5,424,236 | 6/1995 | Daughton et al. | 437/52 |

OTHER PUBLICATIONS

"Magnetoresistive Properties and Thermal stability of Ni–Fe/Ag Multilayers," B. Rodmacq et al., *Journal of Magnetism and Magnetic Materials*, 118 (1993) pp. L11–L16.

"Oscillatory Magnetic Exchange Coupling through Thin Copper Layers," S. Parkin et al., *Physical Review Letters*, vol. 66, No. 16, 22 Apr. 1992, pp. 2152–2155.

"Giant Magnetoresistance in Narrow Stripes," J. Daughton et al., *IEEE Transactions on Magnetics*, vol. 2, No. 5, Sep. 1992.

*Primary Examiner*—Teresa J. Walberg
*Assistant Examiner*—Rapheal Valencia
*Attorney, Agent, or Firm*—Kinney & Lange, P.A.

[57] ABSTRACT

A magnetoresistive layered structure having on a substrate two or more magnetoresistive, anisotropic ferromagnetic thin-films each two of which are separated by an intermediate layer on a substrate of less than 50 Å thickness formed of a substantially nonmagnetic, conductive alloy having two immiscible components therein. A further component to provide temperature stability in some circumstances is to be at least partially miscible in the first two components. Such structures can be formed as a sensor by having them electrically connected together with one positioned in a gap between magnetic material masses and one shielded by one of such masses. The magnetic material mass being used for shielding can be divided into two masses with one of those masses farthest from the gap serving as the shield.

16 Claims, 10 Drawing Sheets

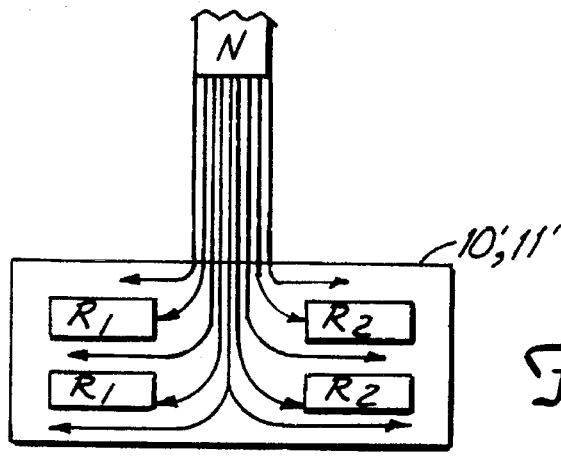
Fig. 7A
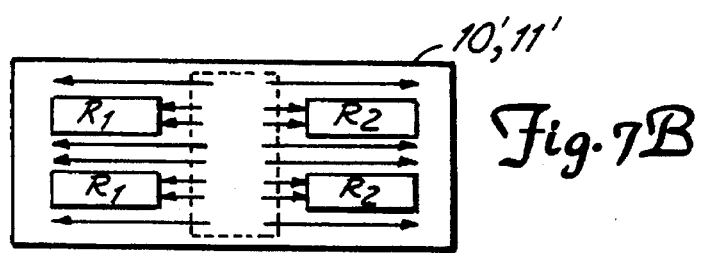
Fig. 7B
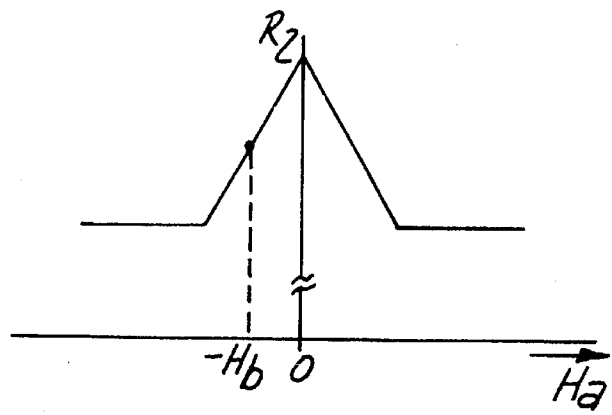
Fig. 8A
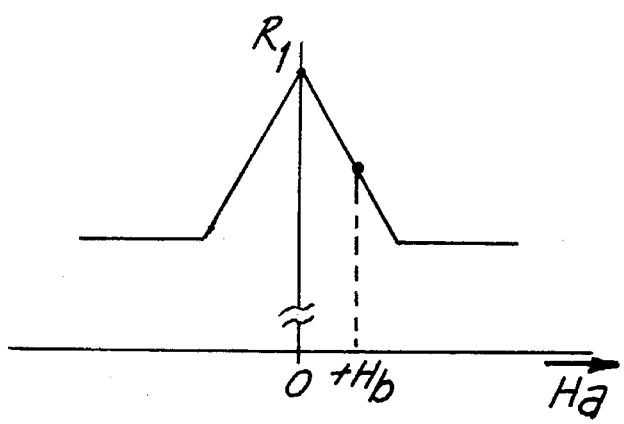

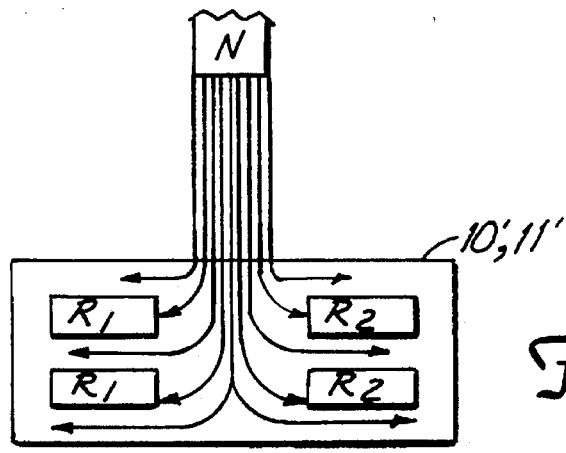
Fig. 7A
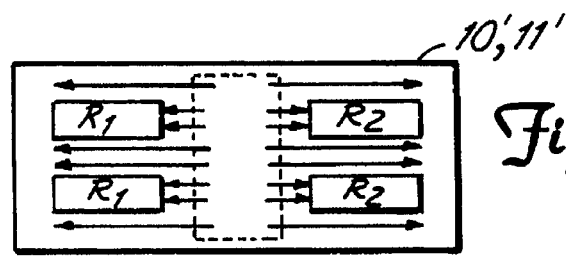
Fig. 7B
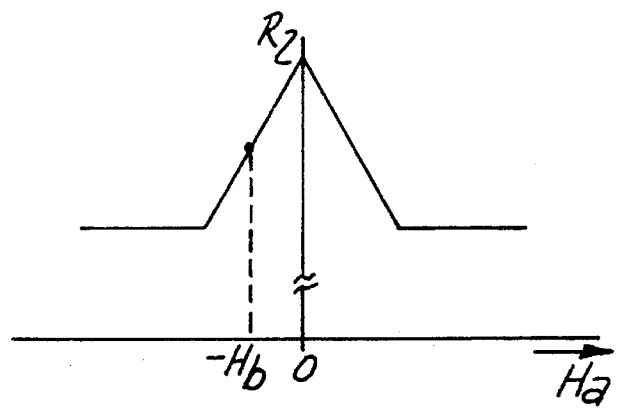
Fig. 8A
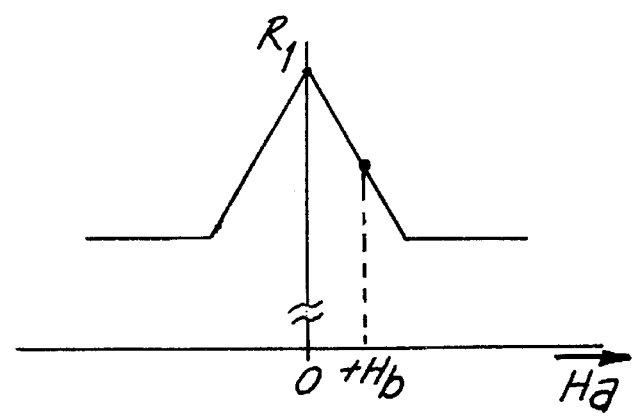

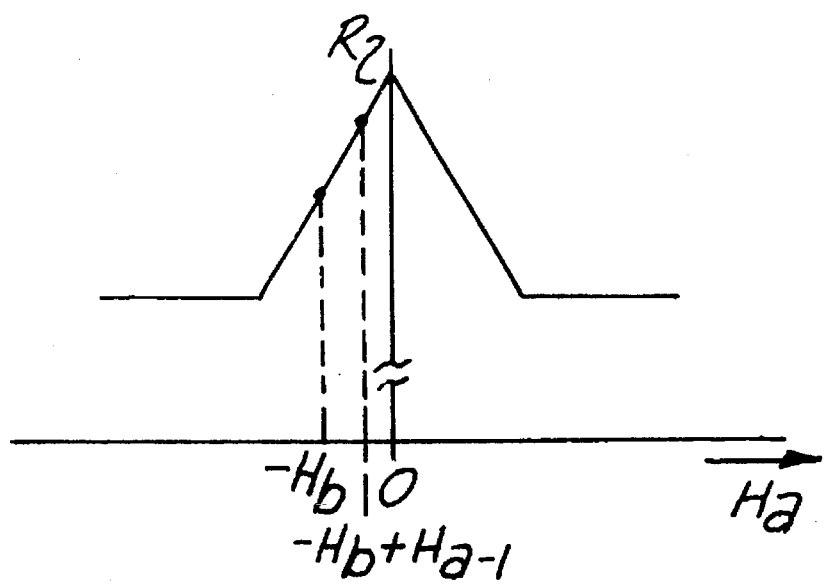
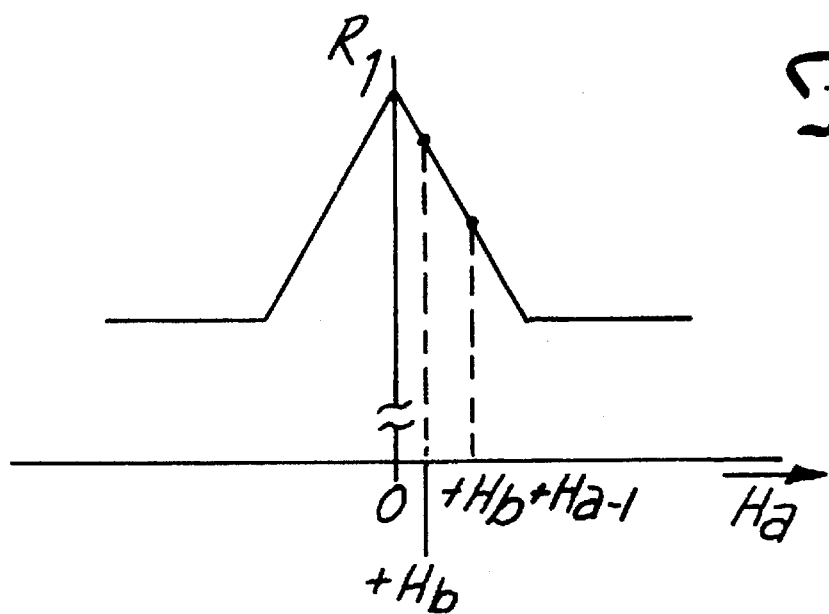
Fig. 8B

MAGNETORESISTIVE STRUCTURE COMPRISING FERROMAGNETIC THIN FILMS AND INTERMEDIATE ALLOY LAYER HAVING MAGNETIC CONCENTRATOR AND SHIELDING PERMEABLE MASSES

This invention was made in part with Government support under Contract DASG 60-92-C-0073 and under Contract DASG 60-93-C-0042 both awarded by the U.S. Army. The Government has certain rights in the invention.

This application is a continuation-in-part application of continuation-in-part application Ser. No. 08/182,614, filed Jan. 18, 1994 which is a continuation-in-part of application Ser. No. 07/976,905, filed Nov. 16, 1992, now abandoned.

BACKGROUND OF THE INVENTION

The present invention relates to ferromagnetic thin-film structures and, more particularly, to ferromagnetic thin-film structures exhibiting relatively large magnetoresistive characteristics.

Many kinds of electronic systems make use of magnetic devices. Digital memories are used extensively in digital systems of many kinds including computers and computer systems components, and digital signal processing systems. Such memories can be advantageously based on the storage of digital bits as alternative states of magnetization in magnetic materials in each memory cell, particularly in cells using thin-film magnetic materials, resulting in memories which use less electrical power and do not lose information upon removals of such electrical power.

Magnetometers and other magnetic sensing devices are also used extensively in many kinds of systems including magnetic disk memories and magnetic tape storage systems of various kinds. Such devices provide output signals representing the magnetic fields sensed thereby in a variety of situations.

Such memory cells and sensors can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

Ferromagnetic thin-film memory cells, for instance, can be made very small and packed very closely together to achieve a significant density of information storage, particularly when so provided on the surface of a monolithic integrated circuit. In this situation, the magnetic environment can become quite complex with fields in any one memory cell affecting the film portions in neighboring memory cells. Also, small ferromagnetic film portions in a memory cell can lead to substantial demagnetization fields which can cause instabilities in the magnetization state desired in such a cell.

These magnetic effects between neighbors in an array of closely packed ferromagnetic thin-film memory cells can be ameliorated to a considerable extent by providing a memory cell based on an intermediate separating material having two major surfaces on each of which an anisotropic ferromagnetic memory thin-film is provided. Such an arrangement provides significant "flux closure," i.e. a more closely confined magnetic flux path, to thereby confine the magnetic field arising in the cell to affecting primarily just that cell. This is considerably enhanced by choosing the separating material in the ferromagnetic thin-film memory cells to each be sufficiently thin. Similar "sandwich" structures are also used in magnetic sensing structures.

In the recent past, reducing the thicknesses of the ferromagnetic thin-films and the intermediate layers in extended "sandwich" structures having additional alternating ones of such films and layers, i.e. superlattices, have been shown to lead to a "giant magnetoresistive effect" being present. This effect yields a magnetoresistive response which can be in the range of up to an order of magnitude greater than that due to the well-known anisotropic magnetoresistive response.

In the ordinary anisotropic magnetoresistive response, varying differences between the direction of the magnetization vector in the ferromagnetic film and the direction of the sensing current passed through the film lead to varying differences in the effective electrical resistance in the direction of the current. The maximum electrical resistance occurs when the magnetization vector in the film and the current direction are parallel to one another, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance follows a square of the cosine of that angle.

As a result, operating external magnetic fields can be used to vary the angle of the magnetization vector in such a film portion with respect to the easy axis of that film portion which comes about because of an anisotropy therein typically resulting from depositing the film in the presence of a fabrication external magnetic field oriented in the plane of the film along the direction desired for the easy axis in the resulting film. During subsequent operation of the device with the resulting film, such operating external magnetic fields can vary the angle to such an extent as to cause switching of the film magnetization vector between two stable states which occur as magnetizations oriented in opposite directions along that easy axis. The state of the magnetization vector in such a film portion can be measured, or sensed, by the change in resistance encountered by current directed through this film portion. This arrangement has provided the basis for a ferromagnetic, magnetoresistive anisotropic thin-film to serve as part of a memory cell.

In contrast to this arrangement, the resistance in the plane of a ferromagnetic thin-film is isotropic with respect to the giant magnetoresistive effect rather than depending on the direction of a sensing current therethrough as for the anisotropic magnetoresistive effect. The giant magnetoresistive effect has a magnetization dependent component of resistance that varies as the cosine of the angle between magnetizations in the two ferromagnetic thin-films on either side of an intermediate layer. In the giant magnetoresistive effect, the electrical resistance through the "sandwich" or superlattice is lower if the magnetizations in the two separated ferromagnetic thin-films are parallel than it is if these magnetizations are antiparallel, i.e. directed in opposing directions. Further, the anisotropic magnetoresistive effect in very thin-films is considerably reduced from the bulk values therefor in thicker films due to surface scattering, whereas very thin-films are a fundamental requirement to obtain a significant giant magnetoresistive effect.

In addition, the giant magnetoresistive effect can be increased by adding further alternate intermediate and ferromagnetic thin-film layers to extend a "sandwich" or superlattice structure. The giant magnetoresistive effect is sometimes called the "spin valve effect" in view of the explanation that a larger fraction of conduction electrons are allowed to move more freely from one ferromagnetic thin-film layer to another if the magnetizations in these layers are parallel than if they are antiparallel with the result that the magnetization states of the layers act as sort of a valve.

These results come about because of magnetic exchange coupling between the ferromagnetic thin-films separated by the intermediate layers, these intermediate layers typically formed from a nonferromagnetic transition metal. The effect of the exchange coupling between the ferromagnetic thin-film layers is determined to a substantial degree by the thickness of such an intermediate layer therebetween. The effect of the coupling between the separated ferromagnetic thin-film layers has been found to oscillate as a function of this separation thickness between these layers in being ferromagnetic coupling (such that the magnetizations of the separated layers are parallel to one another) and antiferromagnetic coupling (such that the magnetizations of the separated layers are opposed to one another, or antiparallel to one another). Thus, for some separation thicknesses, the layer coupling will be of zero value between extremes of such oscillations.

Exhibiting the giant magnetoresistive effect in a superlattice structure, or in an abbreviated superlattice structure formed by a three layer "sandwich" structure, requires that there be arrangements in connection therewith that permit the establishment alternatively of both parallel and antiparallel orientations of the magnetizations in the alternate ferromagnetic thin-film layers therein. One such arrangement is to have the separated ferromagnetic thin-films in the multilayer structure be antiferromagnetically coupled but to a sufficiently small degree so that the coupling field can be overcome by an external magnetic field.

Another arrangement is to form the ferromagnetic thin-film layers with alternating high and low coercivity materials so that the magnetization of the low coercivity material layers can be reversed without reversing the magnetizations of the others. A further alternative arrangement is to provide "soft" ferromagnetic thin-films and exchange couple every other one of them with an adjacent magnetically hard layer (forming a ferromagnetic thin-film double layer) so that the ferromagnetic double layer will be relatively unaffected by externally applied magnetic fields even though the magnetizations of the other ferromagnetic thin-film layers will be subject to being controlled by such an external field.

One further alternative arrangement, related to the first, is to provide such a multilayer structure that is, however, etched into strips such that demagnetizing effects and currents in such a strip can be used to orient the magnetizations antiparallel, and so that externally applied magnetic fields can orient the magnetizations parallel. Thus, parallel and antiparallel magnetizations can be established in the ferromagnetic thin-films of the structure as desired in a particular use. Such a structure must be fabricated so that any ferromagnetic or antiferromagnetic coupling between separated ferromagnetic films is not too strong so as to prevent such establishments of film magnetizations using practical interconnection arrangements.

A broader understanding of the giant magnetoresistance effect, i.e. the spin valve effect, can be obtained by considering a generalized multilayer structure shown in FIG. 1 and ignoring, for simplicity though this is not necessary, the ordinary anisotropic magnetoresistive effect. The structure is typically provided on a semiconductor chip, 10, having suitable operating circuitry therein. An electrical insulating layer, 11, supports N identical ferromagnetic thin-film conductive layers, each separated from an adjacent one by one of N−1 identical nonmagnetic, conductive intermediate layers to form a superlattice structure. A highly resistive outer passivation layer, 12, covers this structure, and suitable electrical interconnections are made to the conductive layers but not shown. The conductance of this superlattice structure will be the sum of the conductances of the individual layers which are effectively electrically in parallel with one another, but the giant magnetoresistive effect introduces magnetization dependence in the ferromagnetic thin-films. In the following, a possible model is developed to an extent as a basis for gaining a better understanding of the electrical and magnetic behavior of this structure, but this model is simplified by approximations and not all would agree with every aspect of the approach chosen.

The conductance of very thin-films is highly dependent on surface scattering if the mean-free path of conduction electrons in the bulk material of the films is equal to or longer than the thickness of the films. The ratio of the film conductivity to the conductivity of the film material in bulk can be expressed as a function of the ratio of the film thickness to the mean-free path of electrons in bulk material identical to the film material by the well known Fuchs-Sondheimer conduction model assuming inelastic scattering at the film surfaces, or by other associated models taking further conditions into account such as grain boundary scattering and other surface scatterings.

The magnetization dependence in the ferromagnetic thin-films leading to the giant magnetoresistive effect appears dependent on the ratio of spin up to spin down electrons in the 3D shell of the transition elements used in the ferromagnetic thin-films, i.e. the spin polarization P of the conduction electrons. The fraction f of 3D electrons which are spin up have typical values of 0.75 for iron, 0.64 for cobalt and 0.56 for nickel. Conduction electrons in metals are normally S shell electrons which theoretically would be equally divided between spin up and spin down electrons. However, because of band splitting the conduction electrons in the magnetic layers are assumed to have a fraction of spin up electrons like that of the electrons in the 3D shell. The spin polarization is then determined from P=2f−1. Such electrons are assumed in encounters with atomically perfect boundaries between the magnetic layers, including in this boundary the thin nonmagnetic, conductive intermediate layer therebetween, to be either scattered inelastically or pass freely into the next magnetic layer.

In view of the observed spin polarization, the simplifying assumption is made that the probability of a spin up electron not being scattered in entering a material having a majority of spin up electrons is approximately equal to the fraction of the electrons in the conduction band which are spin up, and that the probability of a spin down electron going into the same material not being scattered is equal to the fraction of the electrons in the conduction band which are spin down. Changing the magnetization directions between parallel and antiparallel in adjacent ferromagnetic thin-films changes the conduction band electrons in the films from having matching spin up and spin down fractions in each to having opposite spin up and spin down fractions in each. Thus, a larger fraction of the electrons in the superlattice structure will be scattered when the magnetizations in the ferromagnetic thin-films are antiparallel as compared to when they are parallel, since more than half of the electrons in the conduction band are spin up in view of the spin up fraction values given above. If the ferromagnetic thin-films are separated by a conductor layer which preserves the spin of the conduction electrons in passing therethrough, some conduction electrons can pass from one layer to the other without collisions and so can travel through effectively a thicker layer than those which are scattered to thereby be confined within a single layer. As a result, the scattered electrons can have a significantly lower conductivity and so, if the ferromagnetic films are oppositely magnetized, there will be a greater effective resistance in the structure. This view of the conduction electron transport between ferromagnetic thin-film layers can be adjusted for imperfections at the boundaries between adjacent ferromagnetic thin-films for conduction band electrons, which would not be scattered because of the spin thereof, may instead be scattered by physical imperfections at the boundary.

Based on the foregoing, the effective conductivities for parallel and antiparallel magnetization states in the superlattice structure can be determined, and subtracted from one another to provide the ratio of change in effective conductivities of the ferromagnetic thin-films, due to a corresponding change between parallel and antiparallel magnetizations in those films, to the average conductivity in those films. The result of this determination must have added to it the conductivities of the nonmagnetic, conductive intermediate layers on the basis of those layers having equal populations of spin up and spin down conduction band electrons, and a conductivity which does not change with magnetization directions. In such a setting, the ratio of the difference in sheet conductances of the superlattice structure when the ferromagnetic thin-films change magnetization from parallel to antiparallel, $\Delta\gamma_{\perp\to\parallel}$, to the average of these sheet conductances, $\bar{\gamma}_{\perp\to\parallel}$, can be obtained as $$\frac{\Delta\gamma_{\perp\to\parallel}}{\bar{\gamma}_{\perp\to\parallel}} = \frac{NqP^2(\gamma_{mN}-\gamma_{m1})}{\frac{N}{2}[q\gamma_{mN}+(2-q)\gamma_{m1}]+(N-1)q\gamma_{c1}},$$

ignoring the ordinary anisotropic magnetoresistance in obtaining this giant magnetoresistive response as indicated above. Here q represents physical boundary imperfections, and is the probability that a conduction electron which would not be scattered because of its spin is also not scattered by physical imperfections or collisions in the nonmagnetic, conductive intermediate layers.

The symbol $\gamma_{m1}$, is the sheet conductance of a single ferromagnetic thin-film, the sheet conductance per unit square of a thin-film being the conductivity thereof multiplied by the thickness thereof. Thus, $N\gamma_{m1}$ is the sheet conductance of N parallel ferromagnetic thin-films. The symbol $\gamma_{mN}$ is the sheet conductance of a layer of ferromagnetic thin-film N times the thickness of a single ferromagnetic thin-film, and $\gamma_{c1}$ is the sheet conductance of a nonmagnetic, conductive intermediate layer.

The number N of ferromagnetic thin-films affects the differences in sheet conductances because of the difference in conductivity between a ferromagnetic thin-film which is N layers thick compared to N ferromagnetic thin-films electrically connected in parallel. The polarization factor P is, as indicated above, expected to be important in the giant magnetoresistive response in representing the fraction of spin up conduction band electrons, and this expectation is borne out by the square of that factor appearing in the numerator of the equation above.

The quality of the interface between the ferromagnetic thin-films and the nonmagnetic, conductive intermediate layers is important as represented in the last equation by the symbol q. The largest giant magnetoresistive effect values have been obtained in material systems where both the lattice constant and the crystal and the form in the crystal class of each interface material have been well matched. For example, chromium matches the body-centered cubic structure of iron better than all other natural body-centered cubic nonmagnetic metals. Copper is similarly the best match for face-centered cubic cobalt and for face-centered permalloy mixtures which are quite similar to nickel. Significant mismatches will likely give a very low value for q.

Also, scattering in the nomnagnetic, conductive intermediate layers is likely if the thickness of those layers is smaller than the mean-free path of conduction electrons in the bulk film material. Hence, the symbol q will be reduced in value for thicker intermediate films.

The film thickness also has a significant effect on the ratio of $\gamma_{mN}/\gamma_{m1}$ with this ratio increasing as the films get thinner, as shown by the Fuchs-Sondheimer conduction model. The greatest conductivity difference between parallel and antiparallel magnetizations in the ferromagnetic thin-films can be seen, from the last expression above, to occur in the very thinnest of magnetic layers were it not for the scattering and shunting effects of the nonmagnetic, conductive intermediate layers. However, once the conductance of the magnetic layers, decreasing in being made thinner, gets to be on the order of the conductance of the nonmagnetic, conductive layers, the expression above shows that further decreases in thickness will reduce the giant magnetoresistive effect. Thus, for a fixed set of parameters for the nonmagnetic, conductive intermediate layer, the giant magnetoresistive effect will have a peak in value at some ferromagnetic thin-film thickness.

This assumes that the coupling between the structure ferromagnetic thin-films is also arranged to result in an operable device since it determines the range of magnetization angles which can be achieved in a device for given values of applied magnetic fields, so sets limits on the magnetoresistive response. If positive, or ferromagnetic, coupling is present and too great, the film magnetizations will not be sufficiently close to being antiparallel, and perhaps cannot be made so by passing a sensing current through the structure, so that the maximum resistance expected for the configuration cannot be obtained. On the other hand, if negative, or antiferromagnetic, coupling is present and too great, the film magnetizations will not be sufficiently close to being parallel, and perhaps cannot be made so by applying an external magnetic field to the structure, so that the minimum resistance expected for the configuration cannot be obtained.

Further, there is a limit on the thinness of the nonmagnetic, conductive intermediate layer because of "pin holes" occurring therethrough which result in that layer covering less than 100% of the surfaces of the ferromagnetic thin-films on either side thereof. These "pin holes" in the nonmagnetic, conductive intermediate layers are thought to lead to a current density dependence in the giant magnetoresistive effect which is not reflected in the last expression above. Such pin holes in this intermediate layer appear to result in ferromagnetic coupling between the ferromagnetic thin-films on either side of that layer in the vicinity of such holes thereby creating ferromagnetically coupled magnetic domains in these ferromagnetic thin-films which are otherwise antiferromagnetically coupled (assuming no external magnetic fields being applied).

As a result, there appears to be an incomplete saturation of magnetizations across the superlattice along the easy axes so that higher currents through the superlattice structure generate a "scissoring" magnetic field (a field forcing magnetizations in films adjacent an intermediate layer in opposite directions) which counteracts the effects of the pin holes by forcing the magnetizations in the pin hole domains to more closely align with the magnetizations in the rest of the ferromagnetic thin-film in which they occur. Sufficiently high currents can leave a single domain in each such ferromagnetic thin-film.

Although the effect of a very low pin hole density can be perhaps corrected for "sandwich" structures with two magnetic layers by providing a sensing current of a sufficient current density through the superlattice structure, a relatively small increase in pin hole density will quickly lead to all of the ferromagnetic thin-films being ferromagnetically coupled so that the magnetizations therein are in, or near to being in, a common direction. Such a result will make the superlattice structure inoperable as a device, and so there is a desire to provide thin nonmagnetic, conductive intermediate layers with reduced pin hole densities. Further, such layers are desired to be stable in behavior over an extended range of temperatures. In addition, the resulting devices when for use as magnetic field sensors are desired to have a sensing characteristic over a range of magnetic fields which is substantially linear with little hysteresis and high sensitivity.

SUMMARY OF THE INVENTION

The present invention provides a magnetoresistive layered structure having a pair of magnetoresistive, anisotropic ferromagnetic thin-films separated by an intermediate layer on a substrate, and perhaps additional such ferromagnetic thin-films each separated from another by corresponding further intermediate layers. Each such intermediate layer is less than 50 Å thick and formed of a substantially nonmagnetic, conductive alloy having two immiscible components therein. A further component to provide temperature stability in some circumstances is to be at least partially miscible in the first two components. The thin-films may be two-strata or three-strata films each having a greater magnetic moment stratum against an intermediate layer. The resulting devices can be used as magnetic field sensors in a circuit arranged to have at least one positioned in or near a gap between two permeable masses and at least one other positioned adjacent to another side of one of these masses other than one facing the gap or substantially parallel to such a facing side. This later mass can be divided into two masses with the device positioned adjacent the side of that divided mass farthest from the gap.

BRIEF DESCRIPTION OF THE DRAWINGS

FIG. 3 is a graph of a characteristic of a device embodying the present invention, FIG. 4 is a diagrammatic representation of a portion of a device embodying the present invention, FIGS. 7A and 7B are schematic positioning diagrams useable with the present invention, FIGS. 8A and 8B are graphs of characteristics of a device embodying the present invention.

DETAILED DESCRIPTION OF THE PREFERRED EMBODIMENTS

Figure 1:
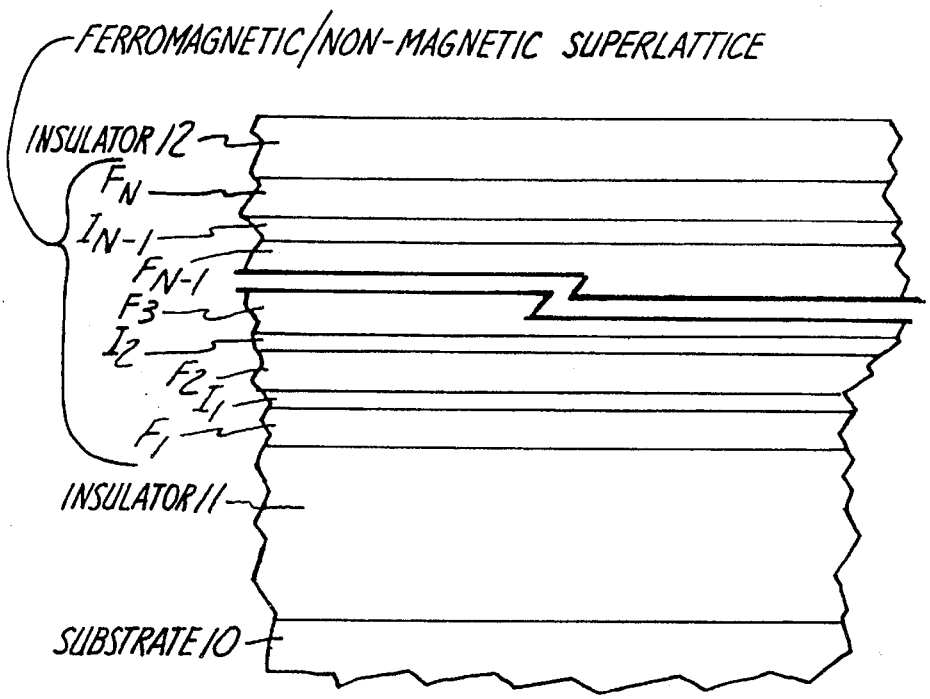
FIG. 1 is a diagrammatic representation of a portion of a device known in the prior art.
Figure 2:
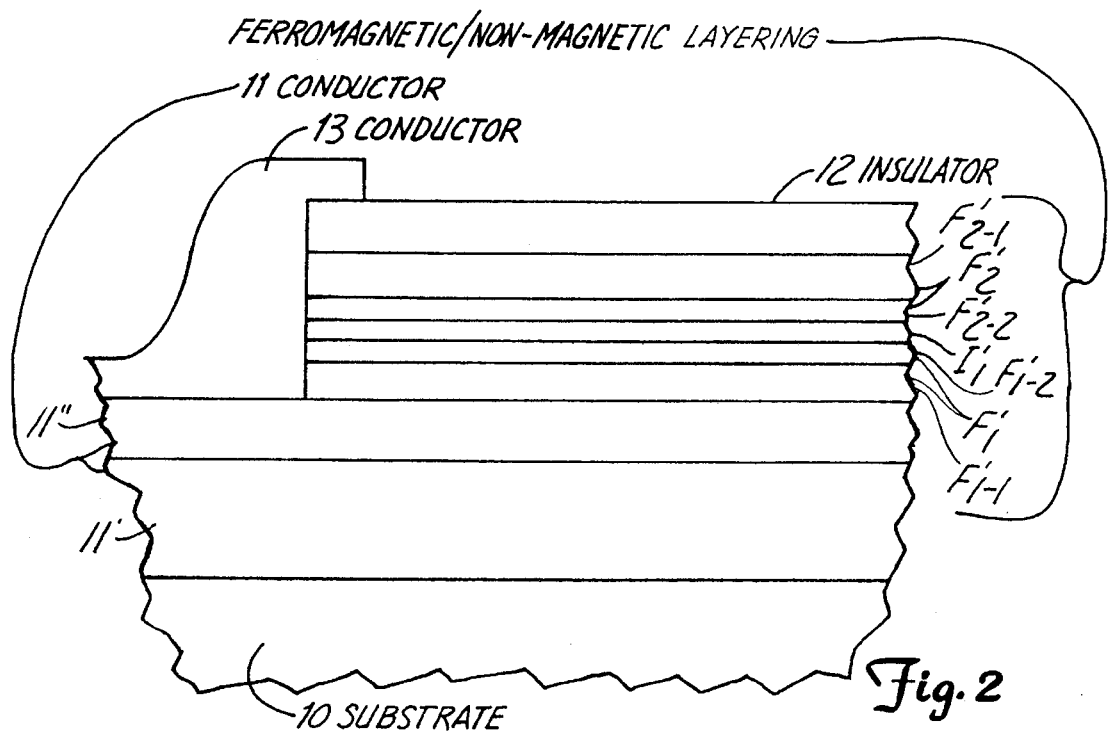
FIG. 2 is a diagrammatic representation of a portion of a device embodying the present invention.

FIG. 2 shows in diagrammatic form a cross sectional view of a portion of a superlattice device formed in a monolithic integrated circuit chip, or on a ceramic substrate, or on other suitable material. Here, a "sandwich" structure with just two ferromagnetic thin-films with general designations $F'_1$ and $F'_2$ is shown separated by an intermediate layer $I'_1$ as an abbreviated superlattice, but additional alternating layer pairs of intermediate layers and ferromagnetic thin-films could be provided in a larger superlattice structure to increase the giant magnetoresistive effect in the same manner as is shown in FIG. 1. FIG. 2 is not to scale, and is not in proportion, for purposes of clarity, which is also true of FIG. 1.

The integrated circuit chip, or other substrate, has again semiconductor material or other suitable material for substrate 10 which, in the situation of semiconductor material in an integrated circuit chip, has therein electronic integrated circuits provided for operating the abbreviated superlattice structure device thereon. Such a device could be intended for use as a memory cell in a digital memory or as a magnetic sensor, for instance. An electrically insulating layer again designated 11 is again provided on substrate 10, the upper surface of layer 11 in the device portion shown supporting the abbreviated superlattice structure indicated above. Insulating layer 11 is shown here as two separate layers, a lower layer, 11', formed of silicon dioxide perhaps 2,000 to 6,000 Å thick, and an upper layer, 11", formed of silicon nitride having a typical thickness of 100 to 1,000 Å. Layers 11' and 11" are typically provided in a well-known sputter deposition step. Use of nitride layer 11" prevents oxygen atoms from diffusing into the layer to be provided thereon which could chemically attack that layer.

The silicon nitride in layer 11" provides an amorphous insulator, that is, an insulator without any periodic structure typical of crystallinity, or, in other words, no long range atomic or molecular order. Alternatively, layer 11" can be formed of a material which has the same form in the same crystallinity class that the next succeeding layer has to provide a possibly better match between these two materials. Since a permalloy material will be used in the succeeding layer in a face-centered cubic structure, an alternative material would be magnesium oxide which also has a cubic structure and a compatible lattice constant.

The next process step in forming the structure of FIG. 2 is the sputter deposition of 40 to 50 Å of a permalloy material comprising 20% cobalt, 15% iron and 65% nickel in the presence of an external magnetic field in the plane of the film oriented along a perpendicular to the view shown in that figure which, as just indicated, results in a film having a face-centered cubic structure. Also, the composition of this mixture in forming a permalloy material leaves the layer with approximately zero magnetorestriction, and the fabrication magnetic field leaves the film easy axis along the perpendicular followed by the fabrication field. The magnetic moment of this material is typically about 12,000 gauss. This is designated in FIG. 2 as component $F'_{1-1}$ of film $F'_1$, and is the first stratum in two strata first ferromagnetic thin-film $F'_1$.

A second stratum, $F'_{1-2}$, is provided in a sputter deposition step, performed in the presence of a similar fabrication magnetic field, as a material formed from 95% cobalt and 5% iron to a thickness of at least 10 Å to get the full giant magnetoresistive effect, and typically of 15 Å thickness. The magnetic moment of this material is 16,000 gauss, a value higher than that of the magnetic moment of first stratum $F'_{1-1}$ in first ferromagnetic thin-film $F'_1$. Since, as a general matter, the polarization of a material and the magnetic moment thereof each tend to increase when the other does, a higher magnetization moment material in the structure ferromagnetic films gives a larger giant magnetoresistive response, as can be seen from the expression above where the square of the polarization appears in the numerator. Thus, having a ferromagnetic stratum with the greater magnetic moment nearest the intermediate layer will typically result in a larger giant magnetoresistive response.

On the other hand, rotating the film magnetization to change its direction in second stratum $F'_{1-2}$ by an external magnetic field during operation is more difficult in this harder magnetic material. As a result, providing first stratum $F'_{1-1}$ as a permalloy material which is a sorter magnetic material than that of the second stratum, the magnitudes required of external magnetic fields in operating the device will be kept at values which do not require too large a current to flow in the interconnections of the device. Hence, a two strata ferromagnetic thin-film provides a more optimal ferromagnetic thin-film for a superlattice structure intended to provide a giant magnetoresistive effect response in a monolithic integrated circuit chip. Also, the magnetostriction for second stratum $F'_{1-2}$ remains near zero so that first ferromagnetic thin-film $F'_1$ will not have undue forces arising between that film and the substrate below, or the film on the other side thereof; in the presence of magnetic fields which could lead to a changing of the film material magnetic properties under the resulting stress or even, at some point, to the possibility of a mechanical failure of the device.

As indicated above, the provision of an intermediate layer, typically copper, in thicknesses below 30 Å leads to increasing pin hole density as the thickness of such a layer diminishes. The magnetic coupling field begins to rise into the tens of oersteds as this copper thickness goes below this 25 to 30 Å value (there is significant variation with different deposition parameter values in the sputter deposition of that layer). Yet, as indicated above, the thickness of the intermediate layer must be reduced as the thickness of the ferromagnetic thin-films is reduced to increase the potential for a larger giant magnetoresistive effect. The thickness of the nonmagnetic, conductive intermediate layer is reduced so that its shunting effect does not become too great with respect to the decrease in conductance of the ferromagnetic thin-films as they are reduced in thickness. Hence, a measure to avoid an increasing pin hole density as the intermediate layer is reduced will provide a basis for achieving a higher giant magnetoresistive effect.

Thus, an intermediate layer, $I'_1$, is provided in the form of an eutectic alloy through including therein two metals as components of the eutectic alloy which are substantially immiscible with one another so that pinholes forming in the larger fraction component are "filled in" to a substantial degree by the smaller fraction component. Since the face-centered cubic crystal structure of copper, and its lattice constant, are well matched with that of second stratum $F'_{1-2}$, as described above, the basic component choice of copper is made for the eutectic alloy to form the intermediate layer. A second component is chosen to be silver which has a face-centered cubic structure like copper although it has a slightly larger lattice constant. Silver and copper are only slightly soluble in one another in forming solid solutions, a few tenths of a percent, and form a eutectic alloy having a conductivity which is about 2 to 3 μΩ-cm in bulk which value is substantially maintained over a wide range of relative composition of these two metals in the resulting eutectic alloy (resistivities of this alloy being a few to several times greater when used to form a thin-film such as that which is to be used to form the intermediate layer).

Though copper is quite able to enter into solid solution with nickel, it will not do so with cobalt or iron, and silver is substantially immiscible with any of these materials also. Hence, a very thin film of a copper and silver eutectic alloy can be formed as a very thin intermediate layer on second stratum $F'_{1-2}$ formed of cobalt and iron, an intermediate layer in which a silver-rich phase material "fills in" the pinholes which occur in the copper-rich phase material constituting the bulk of thin intermediate layer $I'_1$. The typical thickness used for such an eutectic alloy film as intermediate layer $I'_1$ is on the order of 14 to 17 Å, with typically 15 Å being chosen.

In an intermediate layer formed of copper alone provided by sputter deposition, there will be strong ferromagnetic coupling between the ferromagnetic thin-films it separates, whereas the addition to a film of the same thickness of silver from approximately 15% to 28% atomic in the sputter deposition process will result in antiferromagnetic coupling of a relatively low value. Such a result can be extended to a superlattice structure of a larger number of alternating intermediate and ferromagnetic thin-film layers than shown in FIG. 2 with a similar result.

The relative amount of silver in the film has been kept as small as possible in achieving such antiferromagnetic coupling both because silver by itself is known to lead to strong ferromagnetic coupling, and because the lattice mismatch of silver with first ferromagnetic thin-film second stratum $F'_{1-2}$ on each side thereof is significantly larger than is that of copper. Nevertheless, keeping the relative fraction of silver to less than 30% results in the reduction of the giant magnetoresistive response due thereto, because of lattice mismatch, still being substantially less than the gains in the giant magnetoresistive effect due to lowered or eliminated ferromagnetic coupling because of the filled pinholes. In some situations, even greater fractions of silver are expected to be suitable.

Thus, intermediate layer $I'_1$ is formed by sputter deposition using a copper sputtering target. That copper target is supplemented by the addition of silver tabs thereto to the extent needed to result in the desired silver relative fraction of the resulting eutectic alloy, a fraction typically chosen to be 23% to give the desired result. A separate silver sputtering deposition target could be used with a copper target or, alternatively, a copper-silver eutectic alloy target could be used having the same composition as is desired for films deposited therefrom. The intermediate layer from such a deposition step is a metastable face-centered cubic structure which typically remains stable for a long duration if the device is kept within expected temperature ranges during its experience thereafter.

As an alternative to the binary alloy layer formed as an eutectic alloy with grains of silver among grains of copper, gold may be used with the silver and the copper to provide a ternary alloy to serve as intermediate layer $I'_1$. Although a binary alloy layer formed of copper and silver as described above forms an excellent intermediate layer in providing antiferromagnetic coupling between the ferromagnetic layers that are to be provided on either side thereof for the proper thickness selection thereof, the ability of that intermediate layer to provide such benefits has been found to deteriorate at temperatures significantly higher than room temperature, in some instances occurring in just a matter of hours when the temperature reached the vicinity of 150° C. The addition of 5% to 10% atomic of gold to form a ternary alloy system has been found to greatly improve the temperature stability of the magnetic coupling at significantly higher temperatures, i.e. leaving the coupling substantially unaffected until the temperature reaches 200° C. to 250° C.

In one such ternary alloy used in forming this intermediate layer, the intermediate layer by weight was 75% copper, 15% silver and 10% gold to thus form the CuAgAu ternary alloy layer. This is representative of suitable ternary alloy compositions for the intermediate layer in having the portion by weight which is not formed by the gold being split so as to be approximately 80% copper and 20% silver. Providing such a ternary alloy layer by sputter deposition requires adding gold tabs as well as silver tabs to the copper sputter deposition target so that these materials are present in the final target in the proportion desired for each, or the addition of appropriate separate silver and gold targets to the copper target. Alternatively, a ternary alloy of these materials could form a single sputtering deposition target having the proportions of each component therein matching those desired for the layer resulting from the deposition. Again, the result of the sputtering deposition is a layer with a face-centered cubic structure.

The success of such a ternary alloy being used as the intermediate layer comes about for reasons that are not fully known or verified. Although copper and silver are substantially immiscible so that the silver apparently fills in what otherwise might be pinholes in the copper, there is the possibility that at elevated temperatures some of the copper and silver grains in the alloy thereof grow as others shrink. This may result in a structure with significantly larger grains from either draining some, or permitting the occurrence of additional, pinholes, and may form a rougher surface for the intermediate layer. Such addition of pinholes or surface roughness, or both, can severely affect the coupling between the ferromagnetic layers on either side of the intermediate layer. The addition of gold which is miscible with both copper and silver to some degree may form binary alloys at the boundaries of these grains within the ternary alloy layer which impede grain growth to thereby stabilize the layer structure.

The provision of intermediate layer $I'_1$ is followed by providing a second two-strata ferromagnetic thin-film, $F'_2$. A lower stratum for this film, $F'_{2-2}$, is deposited in the same manner as, with the result thereof being substantially the same as, upper stratum $F'_{1-2}$ of first ferromagnetic film $F'_1$. Similarly, an upper stratum, $F'_{2-1}$, of second ferromagnetic film $F'_2$ is deposited in the same manner as, with the result thereof being substantially the same as, lower stratum $F'_{1-1}$ of first ferromagnetic film $F'_1$. Finally, a tantalum nitride layer, 12, is provided on second ferromagnetic film $F'_2$ as a passivation and protection layer. After a completion of passivation layer 12, ion milling is used to form the abbreviated superlattice structure in the form of a strip supported on layer 11". A tungsten interconnection, 13, is shown formed across the end of the abbreviated superlattice structure and onto the upper surface of layer 12.

Thus, the abbreviated superlattice of FIG. 2 provides antiferromagnetically coupled ferromagnetic thin-film layers separated by a nonmagnetic, conductive intermediate layer. This structure has provided coupling fields of 10 to 15 Oersteds, well within the desired range of zero to 50 Oersteds to permit relatively easy manipulations of the magnetizations in the ferromagnetic thin-films of the structure by external magnetic fields. Thus, the magnetizations in each of ferromagnetic thin-films $F'_1$ and $F'_2$ are stable when directed antiparallel to one another in and out of the plane of the paper on which is shown FIG. 2, i.e. along the easy axis of the structure in that figure.

In this last magnetization condition, there is no anisotropic magnetoresistive effect contribution to the resistance of the device since any sensing current passing therethrough from interconnection 13 on the end shown in FIG. 2 to a similar interconnection on the opposite end of the structure, not shown in that figure, is perpendicular to the magnetizations in both ferromagnetic thin-films. The giant magnetoresistive effect gives a maximum resistance in this condition since the magnetizations of the two ferromagnetic thin-films $F'_1$ and $F'_2$, as stated above, have antiparallel magnetizations.

If an external magnetic field is applied directed into the plane of the paper on which FIG. 2 is presented, the anisotropic magnetoresistive effect contribution to the resistance of the device is unchanged since a sufficiently strong external field leaves the film magnetizations parallel to one another. However, assuming the external field is sufficient to rotate the magnetization in the opposite direction in which it was oriented prior to the application of the field, as occurs for the magnetization of one of the ferromagnetic thin-films, the giant magnetoresistive effect contribution to the resistance will be minimized since the magnetizations are then parallel to one another each oriented in the same direction.

If, in the alternative, the external magnetic field is applied parallel to the strip, and so along the plane of the paper in which FIG. 2 is provided, the giant magnetoresistive effect contribution to the resistance will remain a minimum since the magnetization in each of ferromagnetic thin-films $F'_1$ and $F'_2$ will be rotated to point in the long direction of the strip and so be parallel to one another. On the other hand, anisotropic magnetoresistance effect will make its maximum contribution to the resistance since the magnetizations in each ferromagnetic thin-film, in being parallel to the long direction of the strip, are also parallel to any sensing current being conducted between interconnection 13 and its counterpart at the opposite end of the strip.

Such external magnetic fields have been assumed sufficiently large in the foregoing to force the magnetizations in ferromagnetic thin-films $F'_1$ and $F'_2$ to become aligned with the direction of that field. This may be appropriate for use in a magnetoresistive state sensing memory serving as digital memory. Alternatively, the external fields may be such that they cause only partial rotations in the magnetizations allowing the abbreviated superlattice described, or a more extensive superlattice, to serve as a magnetic field sensor.

The abbreviated superlattice structure described above with a ternary alloy forming the intermediate layer, or a more extensive superlattice based on adding timer layers to that structure that are repeats of layers $I'_1$ and $F'_2$, can provide very near to ideal characteristics for a magnetic field sensor. Such a structure can substantially avoid the problems found to occur with the use of other materials in such a superlattice structure for providing a giant magnetoresistive response, for instance, the use of copper alone to form the intermediate layer or layers. The use of other kinds of materials in such a structure leads to structures which typically exhibit relatively high magnetization saturation fields that can lead to insufficient sensitivity in the absence of countering measures, exhibit considerable hysteresis in response to changing exterior magnetic fields, and exhibit a non-linear resistance-magnetic field characteristic often requiring a magnetic bias field to achieve reasonable linearity of the output signal versus the input magnetic field.

A resistance versus applied magnetic field characteristic (scaled from an unpatterned wafer) is shown in FIG. 3 for a magnetoresistive based magnetic field sensor of the kind described above using the alloy materials described above for the nonmagnetic layers therein. This characteristic of the sensor exhibits a maximum resistance change between a zero applied field and a field sufficiently great to reach the minimum resistance possible as a result of the application thereof; i.e. saturation, that is equal to approximately 10% of the total sensor resistance occurring therein for an applied field that provides half, or the average, of such a resistance change. This resistance change due to the giant magnetoresistive effect results from the sensing of an applied magnetic field by this sensor of a magnitude sufficient to align magnetizations of the magnetic layers with the direction of the applied field which is usually applied in a direction perpendicular to that or the easy axis as the direction in which the sensor is most sensitive, though other directions could be used to form a substantially similar characteristic.

The sensor having this characteristic was fabricated generally like the one described above, but with the use of essentially two additional ferromagnetic layers and two additional intermediate nonmagnetic layers (two further high magnetic saturation strata are also required in addition). Also, the intermediate nonmagnetic layers are formed using a ternary alloy system to improve stability with temperature, the alloy in this instance being a mixture of 82% copper, 12% silver and 6% gold used to provide for this structure a layer thickness of 16.5 Å. A representation of this structure is provided in FIG. 4 in which the designations used for the structure layers are a continuation of those used in FIG. 2 except for the interconnection layer at the top and the interior ferromagnetic layers. The interior ferromagnetic layer designations differ in that the interior ferromagnetic layers each have three strata with a central stratum of permalloy type material 40 Å thick as before with a $F'_{x-1}$ designation (using x to represent the ferromagnetic layer number which can be either 2 or 3 for interior layers), a lower stratum of a material having a high magnetic moment 10 Å thick with a $F'_{x-2}$ designation, and an upper stratum of high magnetic moment material also 10 Å thick with a $F'_{x-3}$ designation. The interconnection layer has been redesignated 13' as it is now formed of tantalum rather than tungsten, and the tantalum nitride layer previously used for passivation and protection is no longer present.

As can be seen from FIG. 3, the maximum electrical resistance of the sensor is 9.77 kΩ which occurs in the absence of any substantial magnetic fields. At saturation, which occurs at approximately 200 Oe, the resistance with a field in either direction drops to approximately 8.82 kΩ. The difference between this last resistance and the maximum resistance is approximately 950Ω the maximum possible resistance change.

As can also be seen, the characteristic extending from maximum resistance value (at which the value of the applied field is zero) looks much like the equal sides of an isosceles triangle in that the resistance decreases approximately linearly with applied magnetic field in either applied magnetic field direction. Thus, the magnetoresistive characteristic of the structure is in a region of linear operation essentially from the zero field value until nearly reaching saturation in either applied field direction. Hence, there is no requirement to provide a magnetic field bias to the structure for measuring the magnitude of the applied field to enable the sensing to occur in a linear region of the resistance versus applied field characteristic of that structure.

In addition, the characteristic of FIG. 3 is made following a cycle of change in the applied magnetic field, that field going from zero to one of the saturation values and then through zero again to the other saturation value, and then back to zero. As can be seen, there is very little hysteresis in the resistance characteristic over a cycle of the magnetic field from one saturation value to the opposite saturation value and back. As a result, this resistance characteristic is essentially a single-valued function of the applied field which essentially removes the possibility of an unwanted sudden transition occurring from one resistance value to another at a given field magnitude.

In forming a sensor with such a structure, the magnitude relationship between the magnetic field to be measured and the saturation field for the structure must be considered. If the saturation field of the structure is significantly larger than the applied field to be measured, only a fraction of the possible magnetoresistance change due to the field being measured is usable in the sensor. Thus, there may be difficulty in resolving differences between values of magnitude of fields which are relatively small compared to the saturation field of the structure.

This problem is compounded by the desire to have a relatively large magnetoresistive response, i.e. a giant magnetoresistive response, in the structure to provide an easily used output signal. This is because larger giant magnetoresistive effects in such sensor structures tend to correlate with greater saturation fields characterizing those structures, that is, a relatively large applied magnetic field is needed to saturate the structure resistance change by forcing the initially antiparallel magnetizations in the antiferromagetically coupled magnetic layers to parallel one another.

In this regard, interlayer antiferromagnetic coupling between ferromagnetic layers, each of thickness $T_m$ and saturation magnetization $M_s$, across a conductive nonmagnetic layer is thought to be related to phenomena at the interfaces between nonmagnetic and ferromagnetic layers, i.e. at the abutting surfaces of adjacent layers each of surface area S. The strength of the resulting surface coupling energy is higher for higher saturation magnetization materials (thought to be proportional to the square of the saturation magnetization), but decreases exponentially with increases in thickness $T_c$ of the nonmagnetic layers (although oscillating between ferromagnetic and antiferromagnetic coupling over a range of thicknesses). An externally applied magnetic field in one direction along the easy axes of the ferromagnetic layers can at some magnitude force the magnetizations of these layers to parallel one another along the applied field direction. At that point, the change in coupling energy and the magnetostatic energy of the applied field equal one another. Choosing $E_i$ as representing the surface area energy density difference between parallel and antiparallel orientations of the ferromagnetic layers magnetizations with the effective coupling field (a threshold that the external applied field must reach to reverse the magnetization in the layer which is antiparallel to that applied field) taken as $H_{coupl}$, this energy balance can be approximately written $M_s S T_m 2 H_{coupl} = E_i S$ so that $H_{coupl}$ is found to be $E_i/2M_s T_m$.

If another nonmagnetic layer and another ferromagnetic layer like layers $I'_1$ and $F'_2$ are added onto layer $F'_2$, the lowest energy magnetization configuration in the presence of a small externally applied field is for the two outer ferromagnetic layers to be magnetized in the direction of that field with the interior ferromagnetic layer magnetized in the opposite direction. Thus, in this situation, the interior ferromagnetic layer will have a potential energy due to the externally applied field that is twice the value found for the structure described above since there are now two surfaces resisting the opposite direction reorientation of its magnetization, or $H_{coupl} = E_i/M_s T_m$.

Thus, the coupling field is found to increase with an increase in the number of ferromagnetic layers present in the sensor structure. There is doubt as to whether further coupling field increases occur or not for further additions of nonmagnetic and ferromagnetic layers, there being some thought that increases occur by a factor of $(1-1/N)$ with N being the number of ferromagnetic layers in the structure. In any event, the coupling field increases to at least some degree with the number of ferromagnetic layers and it increases with the saturation magnetization despite Ms appearing in the denominator of the last two equations since $E_i$ is proportional to the square of the saturation magnetization as indicated above. On the other hand, the coupling field will decrease with increasing thickness of the nonmagnetic layer or layers since $E_i$ decreases exponentially therewith. Increasing thicknesses of the ferromagnetic layers will also reduce the coupling field as can be seen by the presence of the factor $T_m$ in the denominator of the last two equations.

Consider now the magnitude of the giant magnetoresistive effect given above as $$\frac{\Delta\gamma_{\perp\rightarrow\parallel}}{\gamma_{\perp\rightarrow\parallel}} = \frac{NqP^2(\gamma_{mN}-\gamma_{m1})}{\frac{N}{2}[q\gamma_{mN}+(2-q)\gamma_{m1}]+(N-1)q\gamma_{c1}},$$

which can be rewritten by noting that the sheet conductances therein can be converted to corresponding layer conductivities through division of these conductances by the corresponding layer thicknesses. That is, substituting for the sheet conductances in the last equation on the basis of $\sigma_{mN}=\gamma_{mN}/T_m$, $\sigma_{m1}=\gamma_{m1}/T_m$ and $\sigma_c=\gamma_c/T_c$ yields $$\frac{\Delta\gamma_{\perp\rightarrow\parallel}}{\gamma_{\perp\rightarrow\parallel}} = \frac{qP^2(\sigma_{mN}-\sigma_{m1})}{\frac{1}{2}[q\sigma_{mN}+(2-q)\sigma_{m1}]+\frac{\left(1-\frac{1}{N}\right)qT_c\sigma_{c1}}{T_m}}.$$

Since P, the polarization of the conduction electrons in the ferromagnetic material is thought to be proportional to the saturation magnetization, the giant magnetoresistive response also increases with increasing saturation magnetization values. That effect also increases with increases in the number of ferromagnetic layers, and with a decreasing thickness of the nonmagnetic layer as can be seen from this last equation. Despite the factor representing the thickness of the ferromagnetic layers which occurs beneath the line in the fraction forming the term on the right in the denominator of the above equation suggesting that the giant magnetoresistive effect decreases with decreases in the value of this factor, the opposite is in fact true. Instead, the giant magnetoresistive effect increases with decreases in this thickness because the numerator factor $(\sigma_{mN}-\sigma_{m1})$ increases even more with decreases in ferromagnetic layer thickness since this effect is thought to depend on surface scattering and such scattering increases with respect to bulk scattering as the ferromagnetic layer is thinned.

Hence, the same parameter changes which lead to higher values for the giant magnetoresistive effect also lead to higher values for the coupling field, and so the high correlation therebetween. As a result, superlattice or sandwich structures designed for high values of the giant magnetoresistive effect will also tend to have high coupling fields leading to relatively large applied field values being needed to reach saturation values of the resistance change present in the structure due to the magnetoresistivity thereof. Thus, a measure is desired that will allow a structure having a large giant magnetoresistive effect to also respond over the much of the possible resistance range change therein to changes occurring in relatively small magnitude magnetic fields in those situations in which such fields are to be sensed.

A mass of magnetically permeable material, especially one which is relatively long compared to its width which is positioned so that its length is aligned with the field component of interest, can concentrate several times the magnetic flux emanating from those surfaces thereof oriented substantially perpendicular to this component over the ambient value of this field component. Such a flux concentrator will thus concentrate the ambient flux in which it is positioned to effectively "amplify" the ambient flux and provide the resulting increase in flux to whatever object is more or less adjacent to such an end. If that object is chosen to be the giant magnetoresistive effect structure described just above, a relatively low ambient field which would be subject to changes therein that would make use of only a relatively small portion of the resistance change available in the structure due to its magnetoresistivity would, by a proper concentrator design, be sufficiently "amplified" so as to make use of nearly all of that available resistance change in that structure. This would give much better sensitivity for that structure despite it having a high resistance saturation field value as is characteristic of the large giant magnetoresistive effect exhibited thereby.

An approximation can be made of the concentration factor for a pair of such flux concentrators where each is formed as a rectangular solid of length L, width W and thickness T, and located with respect to the other so as to have the lengths thereof parallel a common axis but having a gap of length G between them in or near which one or more giant magnetoresistive effect structures of the kinds described above can be positioned. The approximation is based on considering each of these solids as a prolate spheroid having a maximum cross sectional area, perpendicular to its major axis, equal to the cross sectional area of its corresponding rectangular solid perpendicular to its length, and having the length of its major axis equal to the length of its corresponding solid. Any magnetic interaction between a flux concentrator and the other, or with any other magnetic material structure, is ignored as being negligible.

The internal magnetic field, $H_{in}$, in such a mass of magnetic material is the difference between the applied field, $H_a$, and the demagnetizing field resulting therein, $H_D$, or $H_{in}=H_a-H_D$. Since the demagnetizing field is defined as $H_D=4\pi NM$ where N is the demagnetizing factor for the body of magnetic material involved and M is the magnetization thereof which is substantially constant for a prolate spheroid, the internal field becomes $H_{in}=H_a-4\pi NM$. The magnetic flux density in the spheroid is $B_{in}=H_{in}+4\pi M$ or, alternatively, $B_{in}=\mu_r H_{in}$, assuming the flux and internal field are linearly related (not near saturation), where $\mu_r$ is the reversible permeability. Thus, the magnetization can be written from equating the right hand sides of these last two equations as $$M = \frac{(\mu_r - 1)H_{in}}{4\pi}$$

Substituting from the last equation above for $H_{in}$ preceding the two flux expressions yields $$M = \frac{(\mu_r - 1)H_a}{4\pi[1 - N(\mu_r - 1)]}.$$

Thus, if $\mu_r$ is sufficiently large and the magnetic material mass is in the shape of a prolate spheroid with the length of the major axis thereof sufficiently limited to keep N from being too small, $M = H_a/4\pi N$.

A magnetized prolate spheroid is known to be capable of having its contribution to the exterior magnetic field from the magnetization thereof characterized from an effective surface distribution of free magnetic poles. In determining the contribution thereof to the exterior field along the axis extending into the gap from the major axis thereof (this major axis being coincident with the spheroid x axis having $x=0$ at the center of the spheroid, the y axis being along the vertical minor axis thereof with the same origin), an equivalent line pole distribution can be found along the spheroid major axis by finding the change in area of the cross section of the spheroid perpendicular to the major axis thereof for changes in position along this axis multiplied by the approximate magnetization found above. This cross section is a circle of a radius which changes with position along the major axis reaching a maximum value of b on a minor axis at the middle of the spheroid, and has an area, A, which can be written $\pi y^2$ so that its change with x becomes $$\frac{dA}{dx} = 2xy \frac{dy}{dx}.$$

The cross section of the prolate spheroid through both the major axis (x axis) thereof and the minor axis that is also the y axis (a cross section view that is perpendicular to the circular cross section just described) is an ellipse with a minor axis of length $2b = 2(TW/\pi)^{1/2}$ and a major axis of length $2a=L$ which can be described by the equation $$\frac{x^2}{a^2} + \frac{y^2}{b^2} = 1,$$

from which $$dy/dx = -\frac{xb^2}{ya^2}.$$

Noting that the magnetic pole line distribution, $p(x)$, is equal to $-MdA/dx$ since there is a pole density increase toward the major axis ends of the prolate spheroid in the pole distribution towards which the circular cross section area decreases, the pole line distribution is $$p(x) = \frac{2\pi b^2 M}{a^2} x.$$

From electromagnetics theory, the field in the gap due to one of the magnetized prolate spheroid magnetic pole line distributions, $H_{g:ld}$, will be given by the equation $H_{g:ld} = p(x)/r$ where r is the distance front the center of the gap to a magnetic pole in the spheroid given by $r=(G/2+a)-x$. Two such prolate spheroids, one on either side of the gap, means, in the absence of any magnetic interaction therebetween, that the field at the center of the gap will be doubled. Taking into account these considerations, the magnetic field at the center of the gap, $H_{G/2:2ld}$, is found by integrating the field equation over the magnetic pole distribution of one of the spheroids, or $$H_{G/2:2ld} = \frac{4\pi b^2 M}{a^2} \int_{-a}^{a} \frac{xdx}{\left(\frac{G}{2} + a - x\right)^2}.$$

This integration can be carried out to provide a closed form result of $$H_{G/2:2ld} = \frac{4\pi b^2 M}{a^2} \left[ \ln\left(\frac{G}{2L+G}\right) + \left(\frac{L+G}{G}\right) - \left(\frac{L+G}{2L+G}\right) \right].$$

In addition to the field in the gap due to the magnetized solids there is also present the applied field $H_a$ which must be added thereto to obtain the total field at the center of the gap, $H_{G/2:T}$, or $H_{G/2:T} = H_a + H_{G/2:2ld}$. The concentration of the field in the gap due to the presence of the magnetized solids can be characterized by a concentration factor, $C_{G/2}$, formed by the ratio of the total gap field to the applied field, or $C_{G/2} = H_{G/2:T}/H_a$. After substituting the values given above for M, a and b, this factor becomes $$C_{G/2} = \frac{4TW}{\pi L^2 N} \left[ \ln\left(\frac{G}{2L+G}\right) + \left(\frac{L+G}{G}\right) - \left(\frac{L+G}{2L+G}\right) \right] + 1.$$

As is known for prolate spheroids, the demagnetizing factor N therefor, for applied fields along the major axis thereof, is $$N = \frac{4TW \left[ \ln\left(L\sqrt{\frac{\pi}{TW}}\right) - 1 \right]}{L^2 \pi},$$

which results in a concentration factor of $$C_{G/2} = \frac{1}{\ln\left(L\sqrt{\frac{\pi}{TW}}\right) - 1} \left[ \ln\left(\frac{G}{2L+G}\right) + \left(\frac{L+G}{G}\right) - \left(\frac{L+G}{2L+G}\right) \right] + 1.$$

Because of the approximations made, especially the ignoring of the interaction between the two magnetized solids, this result has been found to be low by a factor of approximately two. Nevertheless, the relative importance of the various parameters involved in the concentration of the applied field is indicated by this result.

Figure 5:
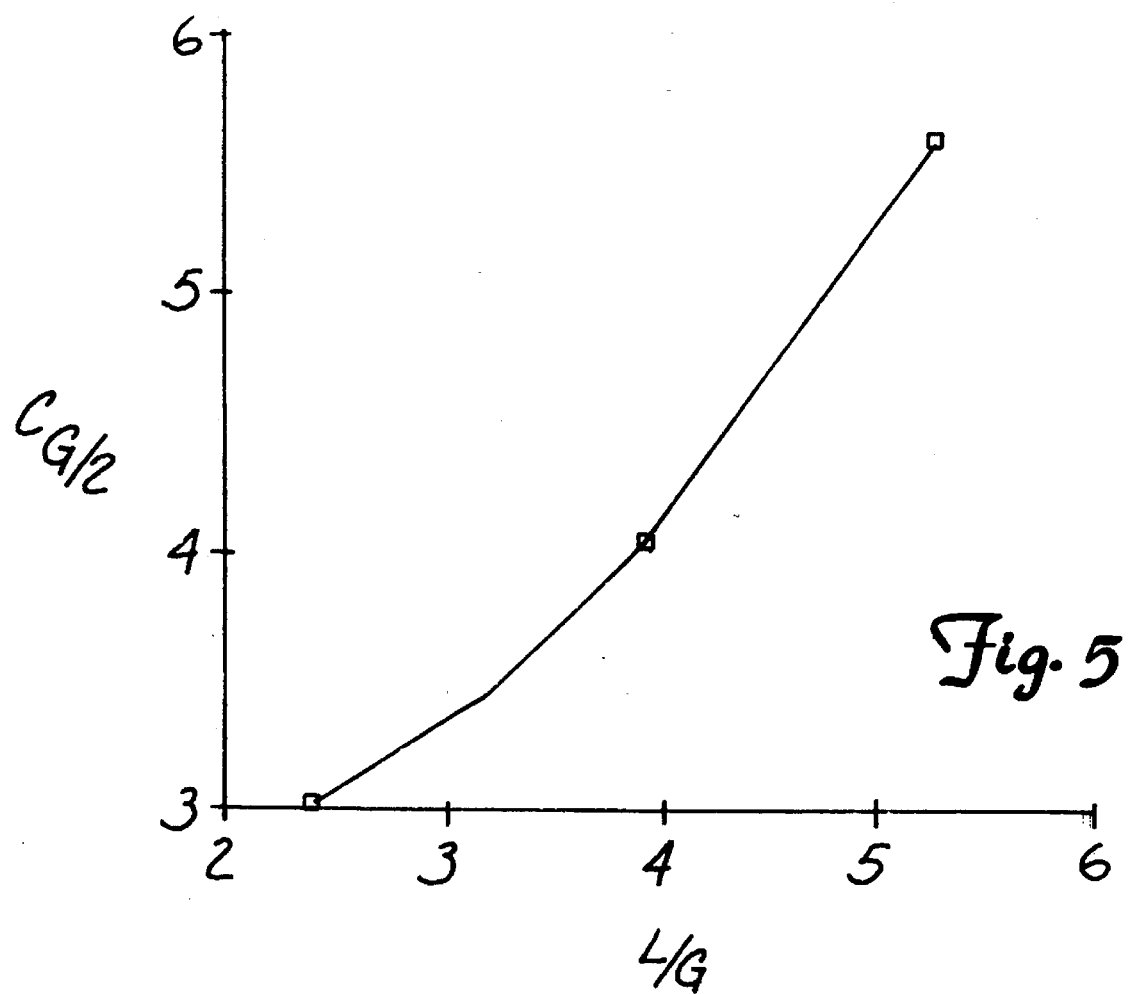
FIG. 5 is a graph of a characteristic of a series of devices embodying the present invention.

The permeability of the magnetic material used in the solids is unimportant if it is sufficiently large, i.e. greater than a thousand, as it then no longer significantly affects the magnetizations thereof if the lengths of the concentrator solids are not too great. The thickness and width of the solids is also relatively unimportant as can be seen from the last result although certainly there should be enough magnetic material present so that the concentrator magnetic materials do not reach magnetic saturation before any giant magnetoresistive effect structures positioned in the gap therebetween experience magnetic fields sufficient to saturate the resistance change due to that effect. Rather, the ratio of the length of each of the solids to the length of the gap is important. This is seen in the graph of FIG. 5 plotting the measured field concentrations in the gaps of similar devices to the corresponding concentrator length-to-gap length ratio. As can be seen, at larger length ratios the concentration factor is numerically quite similar in value to corresponding length ratio value.

Thus, the giant magnetoresistive effect structures described above can be provided with greater sensitivity in sensing smaller applied magnetic field changes by being located in the gap between two concentrators of significant length along an axis passing through each and the gap. In practice, more than a single such structure will usually be positioned in the gap to experience and react to concentrated magnetic fields there as these structures are usually connected in some sort of multiple structure electrical interconnection arrangement such as a bridge circuit. Such circuit arrangements are usually provided to both conveniently provide for the electrical energization of the various structures present and for the measuring of signals generated thereby under the influence of applied external magnetic fields.

Figure 6A:
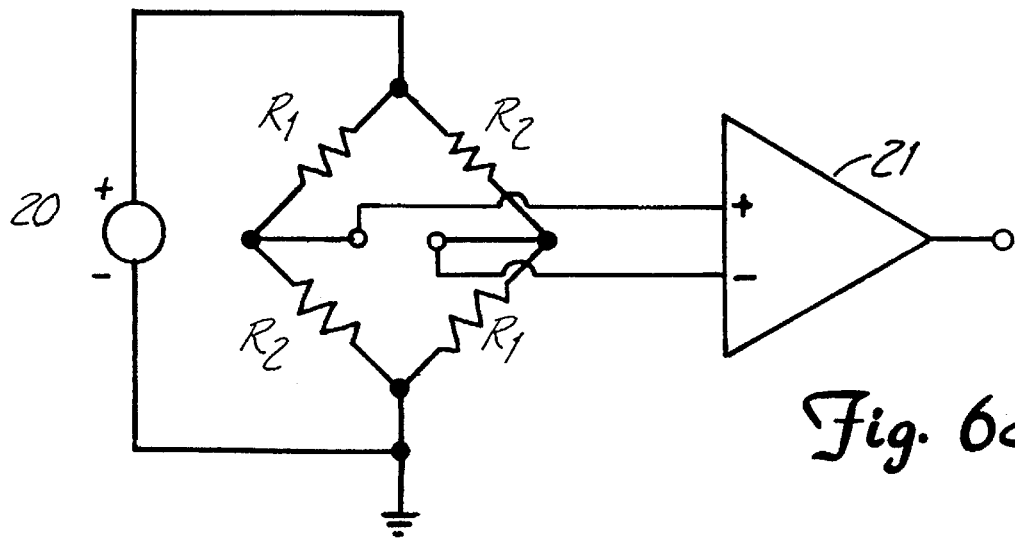
FIGS. 6A and 6B are schematic diagrams of circuits useable with the present invention.
Figure 6B:
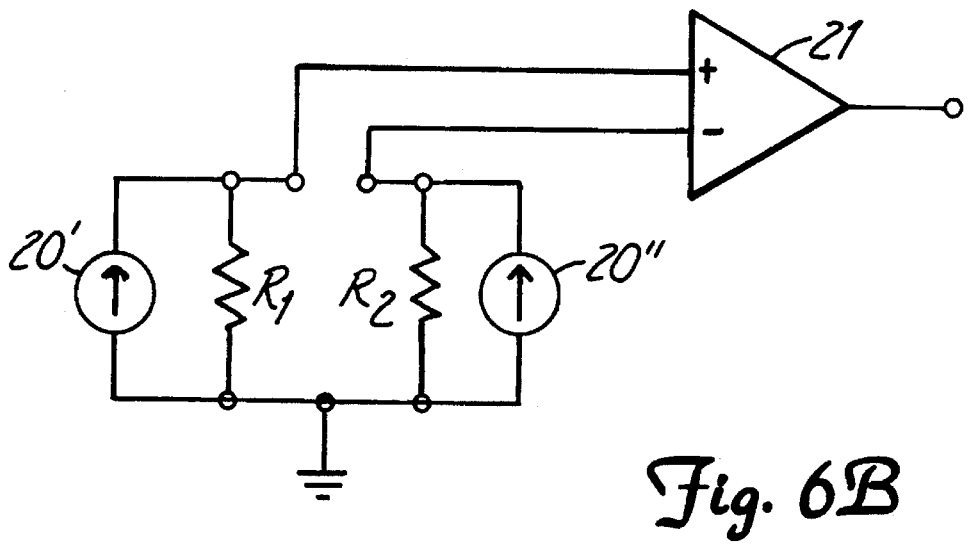

As examples, a bridge circuit in which giant magnetoresistive effect structures are represented as circuit resistors is shown in schematic form in FIG. 6A. A voltage source, 20, is shown connected between two opposing nodes of that circuit at each of which two of the four such resistors are electrically connected, the negative side of the source being shown grounded. In addition, the inverting and noninverting inputs of a signal sensing amplifier, 21, are each electrically connected to an opposite one of the two remaining opposing nodes in the bridge circuit at each of which also two of the four resistors are electrically connected. In FIG. 6B, two giant magnetoresistive effect structures are shown as circuit resistors with one end of each being electrically connected to ground. A pair of current sources, 20' and 20", each also have one end electrically connected to ground, and the opposite end thereof is electrically connected to (a) a corresponding one of these resistors, and (b) a corresponding one of the inverting and noninverting inputs of a signal amplifier, 21'.

In each of these figures, the symbols $R_1$ and $R_2$ are used to both designate the structures, or resistors, and to represent the electrical resistance values thereof, there being two pairs of equal value resistors in the FIG. 6A circuit. Typically, the structures serving as the resistors in either of these circuits are fabricated to match one another (although they need not be), and so have substantially identical resistance values under identical conditions.

In each of these circuit arrangements, adjacent ones of the resistors in the circuit must vary differently from one another under an applied magnetic field if a signal output is to result. If they each have the same variation, there will be a zero value signal developed between the sensing amplifier inputs. This will be true even if the field direction is reversed for adjacent resistors but of the same magnitude for each because the characteristic shown in FIG. 3 shows the same resistance value will still occur for each resistor. Thus, the magnitude of the fields to be sensed by these circuits must differ for adjacent resistors therein to provide a sensing signal representing those fields. If the magnitudes of the fields, or the changes in the fields, to be sensed are sufficiently large, flux concentrators need not be used with the giant magnetoresistive effect structures (or resistors) in either of these circuit arrangements, but for smaller magnitudes such concentrators can be used with those structures in either circuit.

The giant magnetoresistive effect structures, or resistors, in either of these circuits will be arranged in use so that the lengths thereof will primarily parallel the direction along which the applied magnetic fields are to be sensed, and also parallel the long axes of any flux concentrators that are used therewith. If opposite pairs of the resistors of FIG. 6A are sufficiently separated from one another in space, or if the two resistors in FIG. 6B are sufficiently separated from one another in space, so that different magnitudes of the applied magnetic field are present at these separated locations, the output signals from the circuits will represent the gradient of the applied field. Thus, spatial variation in the magnitude of the applied magnetic field can be used to provide an output signal in these circuits.

However, such spatial variation may not be of interest, or available in the confines of an integrated circuit in which such circuits are provided. In such circumstances, design measures must be taken to assure the desired applied magnetic field magnitude differences at the circuit structures or resistors. Such measures will be described with respect to the circuit of FIG. 6A but can be used with the circuit of FIG. 6B if desired. The first option to be described is the use of a biasing magnetic field that biases different structures or resistors used in the circuit differently.

Thus, in the circuit of FIG. 6A, the opposite pairs of structures or resistors are biased by a locally provided magnetic field in opposite directions along the desired measurement direction so that an applied magnetic field which will be oriented in a single direction will increase the total field in one of the pairs but decrease the total field in the other. Two examples are shown in FIGS. 7A and 7B with the structures or resistors of the FIG. 6A circuit shown provided on a substrate, 10',11', so that the two resistors designated $R_1$ are positioned as a group on the left side of substrate 10', 11' and so that the two resistors designated $R_2$ are positioned as a group on the right side of substrate 10',11', with the resistors of each group having the primary lengths thereof parallel with, and extending toward, those of the other. Though not shown, these resistors are interconnected in the circuit of FIG. 6A.

In FIG. 7A, a permanent bar magnet is placed in plane parallel to the plane in which substrate 10',11' extends with the magnet length axis centered between the two resistor groups. As a result, the magnetic field emanating from the magnet end nearest the substrate has components in it which pass in one direction through the resistors in one of the two groups thereof and in the opposite direction through those in the remaining group, these field components passing through the primary lengths of each member of each group. Thus, the resistors in each group are magnetically biased in a field direction opposite the direction in which they are biased in the other group. Alternatively, the permanent bar magnet is positioned underneath substrate 10',11' (shown in dashed lines in FIG. 7B) with its length axis perpendicular to the plane of extent of that substrate to provide substantially the same result. If the permanent bar magnet is formed of a material to have a fairly large saturation induction of 5000 Gauss or more, and a large coercive force of 2000 Oe or more, the bias magnetic field provided thereby will not vary much with the applied field to be sensed.

The corresponding resistance versus applied field characteristics for the biased resistors of FIGS. 7A or 7B, approximated by two sides of a triangle, are shown for a resistor from each group. The operating points due to the bias, or the bias points, for a bias magnetic field component of magnitude $H_b$ resulting for these resistors are marked on these characteristics in FIG. 8A as darkened dots, but with one shown as negative bias and the other positive in keeping with the opposite direction bias field components in each. In FIG. 8B, the result of such biased resistors experiencing an applied field $H_a$ from a source external to the systems of FIGS. 7A or 7B that is to be sensed of magnitude $H_{a\text{-}1}$ is shown. This external applied field will have any component therein along the primary lengths of the resistors in either group be in the same direction for both so that the total field for the $R_1$ resistors increases to decrease the resistance values thereof, but the total field decreases for the $R_2$ resistors to increase the resistance values thereof. The result is to give the new operating points for these resistors marked by darkened dots in FIG. 8B. Reversing the direction of the sensed field will give the opposite result instead of increases in resistance value for $R_1$ resistors and decreases for $R_2$ resistors.

Such arrangements as shown in FIGS. 7A and 7B will probably, because of the biasing requirements, be used without the presence of flux concentrators that would complicate setting the biasing magnetic field although not necessarily. In any event, as shown, these arrangements result in a sensor that is sensitive to both the magnitude of the applied magnetic field to be sensed, and to the direction thereof. This can be seen from finding the output signal, $v_s$, for such an arrangement serving as an input to the sensing amplifier by noting that the two sides of the FIG. 6A circuit across voltage supply 20 are each voltage dividers. Using the well known voltage divider equation and taking the supply voltage to be of value V, the voltages at the center node of each divider can be found and subtracted to provide this output signal, or $$v_s = \frac{R_2 V}{R_1 + R_2} - \frac{R_1 V}{R_1 + R_2} = \frac{(R_2 - R_1)}{(R_1 + R_2)} V.$$

Returning to FIG. 8B, the positive applied magnetic field portion of the $R_1$ resistor characteristic, involved because of the direction of magnetic field bias chosen, can reasonably be represented by a linear function with a negative slope between a zero applied field value and approximately the applied field value saturating the giant magnetoresistive effect resistance change. Such a function can be written as $$R_1 = R_o - K(H_a + H_b),$$

where $R_o$ is the structure resistance value in the absence of an applied magnetic field, and K is the effective conversion constant between the applied field and the resulting resistance value due to the giant magnetoresistance effect. Similarly, the negative applied magnetic field portion of the $R_2$ resistor characteristic, again involved because of the direction of the magnetic field bias chosen, can reasonably be represented as a positive slope linear function or $$R_2 = R_o + K(H_a - H_b).$$

Substituting these last two representations into the expression for the bridge output signal given just preceding them gives the result $$v_s = \frac{KV}{(R_o - KH_b)} H_a.$$

Thus, the output signal will follow the magnitude of, and its polarity follow the direction of, the applied magnetic field to be sensed at least so long as that field has a magnitude which does not exceed the bias field.

An alternative implementation of the FIG. 6A bridge circuit which also provides differing responses in the bridge circuit resistors, or structures, to an applied magnetic field to be sensed is to form either the $R_1$ resistors or the $R_2$ resistors of a material which does not respond to such an applied field.

A better result for this kind of implementation can be obtained by forming all of the bridge circuit structures, or resistors, as before but shielding either the $R_1$ resistors or the $R_2$ resistors to prevent them from experiencing the applied field by positioning a mass of highly permeable material over them. Then an output signal from the bridge circuit representing the applied magnetic field can be obtained, and the similar or matching responses of each of the structures, or resistors, used in the circuit to operating temperature changes will be balanced against one another. As a result, the response of the bridge circuit in its output signal to such temperature changes will be reduced or cancelled.

A shield, to be effective in preventing an applied magnetic field from significantly affecting the resistors on the substrate thereunder, must not saturate since the relative permeability thereof must be large to provide good shielding of regions close thereto. This can be seen from the expressions given above for fields in a magnetic material mass for which the magnetization away from saturation was found in terms of the internal field to be $$M = \frac{(\mu_r - 1) H_{in}}{4\pi},$$

and the internal field was given as $H_{in} = H_a - 4\pi NM$. Eliminating the magnetization between these expressions allows the internal field to be found as $$H_{in} = \frac{H_a}{(\mu_r - 1)N + 1} \approx \frac{H_a}{N\mu_r},$$

the approximation assuming again that $\mu_r$ is sufficiently large and that the magnetic material mass is in the shape of a prolate spheroid, or a rectangular solid that can be approximated by a prolate spheroid, with the length of the major axis thereof sufficiently limited to keep N from being too small.

The tangential magnetic fields at an interface between two dissimilar materials are known from electromagnetics to be equal. Thus, since this internal field is taken parallel to the major axis of the shield approximated as a prolate spheroid, there will be a magnetic field just outside the top, bottom and side surfaces thereof equal to $H_a/N\mu_r$. In other words, the field just exterior to these shield surfaces is reduced from the value of the applied field by a factor of $1/N\mu_r$. Use of the demagnetizing factor given above for a prolate spheroid results in this surface location reduction factor being equal to $$\frac{1}{N\mu_r} = \frac{\pi L^2}{4\mu_r TW \left[ \ln\left( L\sqrt{\frac{\pi}{TW}} \right) - 1 \right]}.$$

Thus, within fabrication process limitations, given responsive choices for the other parameters and suitably large relative permeability of the shied material, the shield thickness can be increased sufficiently to provide the desired surface location field reduction factor value at the surfaces indicated shove.

There is a limit to how closely the resistors being shielded can be positioned in the substrate next to the shields, however, and the reduction in the field diminishes the further away from the shield material the resistor position occurs until some separation between them is enough so that the local field there has essentially the value of the applied field. Thus, there is a remote location field reduction factor that depends on the geometrical relationship between the shield and the resistor location which diminishes with increasing separation of the shielded resistors from the shield. Approximating a rectangular solid mass of magnetic material used for a shield again as a prolate spheroid and assuming the resistors being shielded are positioned below the center of that solid, magnetostatics considerations provide the change in field as a function of the distance into the substrate, z, separating the resistors from the shield. Assuming no interactions with other magnetic materials and with the applied field provided along the major axis of the prolate spheroid, the field component parallel to the applied field at distance z into the substrate is found from the tangential field present at the substrate interface surface equal to $H_{in}$, as found above, multiplied by a geometrical dependent remote location field reduction factor, the result of which is then summed with the applied field. That factor is found to be $$\frac{LW^2}{2(L^2-W^2)^{\frac{3}{2}}} \left[ \ln\left( \frac{\sqrt{z^2+L^2-W^2} - \sqrt{L^2-W^2}}{\sqrt{z^2+L^2-W^2} + \sqrt{L^2-W^2}} \right) + \frac{\sqrt{L^2-W^2}}{\sqrt{z^2+L^2-W^2}} \right].$$

The logarithmic term in the last expression, in having a fractional argument, has a negative value to result in a term in the full field component expression that is subtracted from the applied field to account for the shielding effect on resistors located sufficiently near the shield. Taking the maximum value of z as −c to evaluate this expression, and finding the expression value at proposed shield-resistor separations, allows forming a ratio giving the fractional change of the increase in the field in the applied field direction. A limit on this increase determines the allowed separation for a given set of length and width values for the rectangular solids. Meeting that limit and accommodating the separation minimum resulting in the fabrication process may result in having to adjust the difference between the shield length and width to obtain the desired shielding effect.

Although the desired value for the surface location field reduction factor at the surfaces indicated above may set a minimum thickness limit on the rectangular solid magnetic shield material, a further limit must be considered to also satisfy another requirement given above. That is, the shield material must be present in sufficient quantity to prevent saturation thereof by the applied field if the shielding effect is to be maintained. If the saturation demagnetizing field, $H_{D-sat}$, is greater than the maximum applied field, the shield material will not saturate. As indicated above, the demagnetizing field can be represented as $H_D=4\pi NM$. Using the demagnetizing factor given above for a prolate spheroid, this becomes $$H_D = \frac{16TW\left[ \ln\left( L\sqrt{\frac{\pi}{TW}} \right) - 1 \right] M}{L^2}.$$

Setting $M=M_{sat}$, or to the magnetization saturation value, and using the typical known value therefor for permalloy materials of around 10,000 Gauss, allows finding the saturation demagnetizing field from this expression. Knowing the range of applied fields expected to be sensed, the shield geometric parameters can then be adjusted to prevent the saturation demagnetizing field from being as small as the maximum value in that range.

Operating the circuit of FIG. 6A with such a shield over each of the resistors $R_2$ would, from the equation therefor given above assuming no effective bias field present, leave them exhibiting the resistance value $R_o$ substantially independent of the applied magnetic field, whether applied in the positive or negative direction, because of the shield thereover. The resistance values of resistors $R_1$, also assuming no effective bias field present, for positive direction applied fields, would, from the equation above be $$R_1=R_o-KH_a.$$

A review of the resistance characteristic in FIG. 8A, ignoring the bias field shown there, shows the negative field portion of the characteristic would be represented by the same equation since the slope of that portion is positive. Substituting these results into the equation given above for the signal voltage $v_s$ in the circuit of FIG. 6A yields $$v_s = \frac{KV}{(2R_o - KH_a)} |H_a|,$$

which, for $R_o$ much greater than $KH_a$, is substantially linear with $|H_a|$. Thus, such a sensor using the bridge circuit of FIG. 6A with two of the structures, or resistors, shielded is an absolute value applied magnetic field sensor.

As the concentration factor found above did not depend strongly on the concentrator thickness, and as the shielding requirements do depend significantly on the shield thickness, a very compact, high performance magnetic sensor can be fabricated for sensing magnetic fields, especially fields smaller in magnitude than the fields which would saturate the giant magnetoresistive effect resistance characteristic for the structures described above. If two separated magnetic material masses are provided in shapes suitable for use as flux concentrators for two of the giant magnetoresistive effect structures, or resistors, in the circuit of FIG. 6A, one of those same masses may concurrently be also be provided in a shape suitable for an additional use as a magnetic shield for the other two structures or resistors in that circuit. Such a structural arrangement is shown in FIGS. 9A and 9B.

Figure 9A:
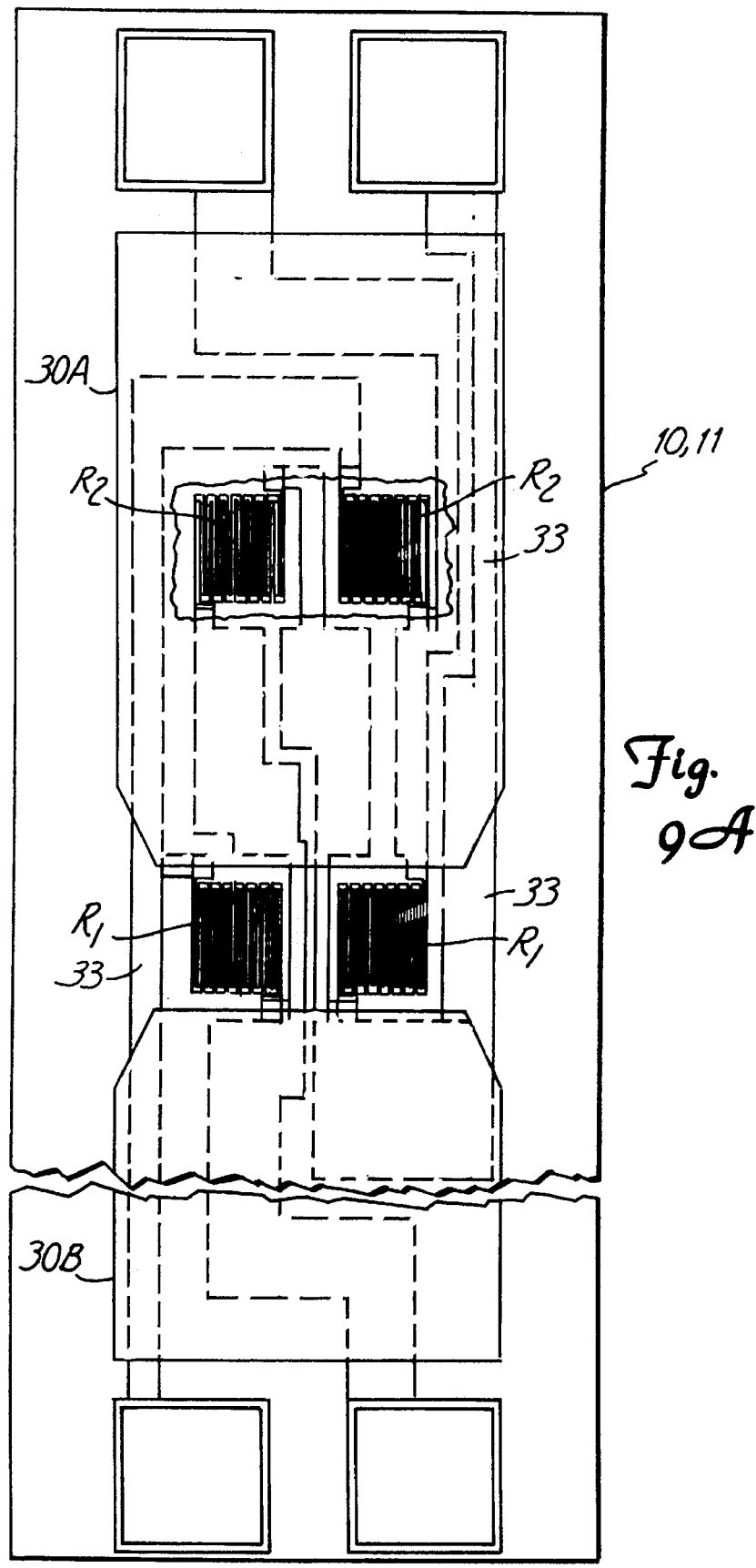
FIGS. 9A and 9B are diagrammatic representations of a device embodying the present invention.
Figure 9B:
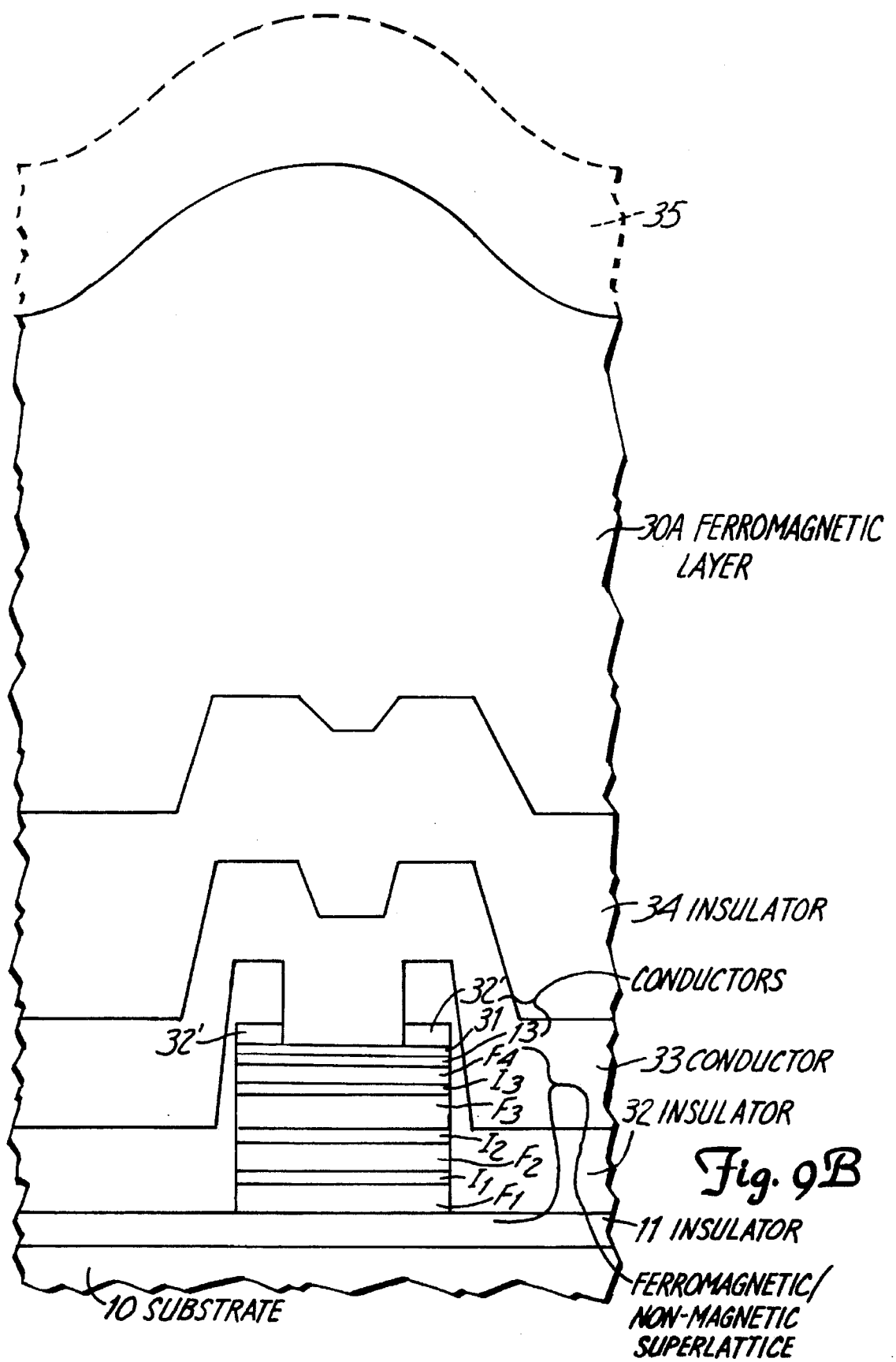

The device shown in plan view in FIG. 9A is formed as a monolithic integrated circuit on semiconductor chip substrate 10, 11 so operating circuitry can be conveniently provided therewith, but could alternatively be formed as a hybrid integrated circuit on a ceramic substrate. A concentrator-shield, 30A, and a concentrator, 30B, formed of permalloy (typically comprising around 80% nickel and 20% iron to provide approximately zero magnetorestriction for these masses on the support layer therefor over the resistors provided on substrate 10, 11) are shown in that figure over a part of the integrated circuitry in that device which is an implementation of the bridge portion of the FIG. 6A circuit schematic diagram. The optional protective layer that can be provided over these concentrators has been omitted in this view for clarity so they are shown in solid line form, but the direct sensor circuitry below them is indicated in dashed line form (no integrated circuits in substrate 10,11 are shown) except at the opening over resistors $R_2$ and in solid line form elsewhere.

Each of the two resistors $R_1$ is positioned in the gap between, and somewhat below, concentrator-shield 30A and concentrator 30B, and formed in serpentine fashion with each of the many successive major length portions thereof, typically just under 90 μm long, being parallel to each other and to the long axis of concentrator-shield 30A and concentrator 30B to thereby be aligned with the concentrated field component resulting therefrom along this axis. Only very short connections perpendicular to this axis are used to interconnect the ends of such a resistor length to the corresponding ends of one or the other of adjacent such lengths such that the dimension of the resistor considered as a whole in the direction perpendicular to the resistor lengths is somewhat less than that of such a resistor length.

Figure 10:
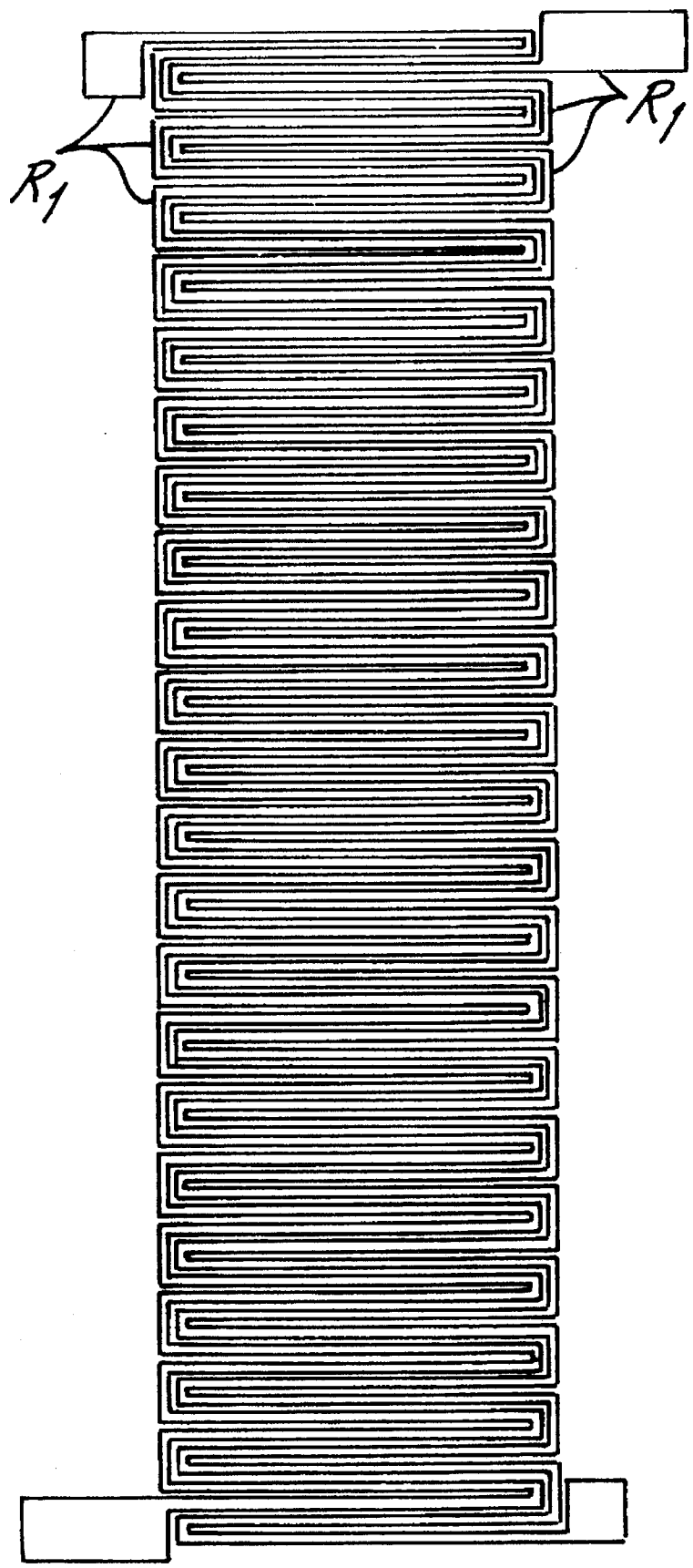
FIG. 10 is a diagrammatic representation of an alternative for a portion of the device shown in FIGS. 9A and 9B.

An alternative arrangement for resistors $R_1$ is shown in FIG. 10 where these two resistors are shown "interleaved" with one another. Such an arrangement can result in a better match of characteristics between these two resistors if instead used but at the cost of providing a crossover for the interconnecting circuitry.

Resistors $R_2$, on the other hand, are positioned under concentrator-shield 30A below more or less the center thereof but otherwise formed in the same manner as are resistors $R_1$. There, resistors $R_2$ are substantially shielded from applied magnetic field components occurring along the long axis of concentrator-shield 30A and concentrator 30B. Resistors $R_2$ could also alternatively be interleaved with one another in the manner, for instance, shown in FIG. 10.

Typical dimensions for concentrator-shield 30A and concentrator 30B in FIG. 9A are a length of 405 μm, a width of 250 μm, and each having a thickness of 12.5 μm. Concentrator-shield 30A, as a result of the fabrication process result. is located approximately 2 μm above resistors $R_2$. The gap separating concentrator-shield 30A and concentrator 30B is typically just a bit greater than 90 μm. On the gap end of each of concentrator-shield 30A and concentrator 30B a 1:2 taper has been used to slightly narrow the gap ends, each edge of each gap end being 25 μm inward from the corresponding one of the main sides with the tapering beginning 50 μm back from the gap ends. Typical dimensions of the integrated circuit chip serving as the sensor substrate would be 77 mils by 18 mils.

The thickness and position separation dimensions just given can be better seen and understood in FIG. 9B which is a fragmentary cross section view of a portion of FIG. 9A taken at a position to show part of a resistor $R_2$. This view also helps to understand the fabrication process in showing some of the structures resulting from practicing the steps of that process for which the main steps will now be described.

Silicon wafer 10 has about 10,000 Å of silicon nitride 11 provided on it by sputter deposition to form substrate 10,11. A giant magnetoresistive multilayer, having a sheet resistivity of about 12 Ω/□, or higher, with a giant magnetoresistive effect exceeding 10% and a saturation field of about 200 Oe, is sputter deposited, as described above, onto nitride 11 in a sputter deposition machine as the basis for the circuit resistors. This multilayer (which will be about 400 Å thick) is passivated with 100 Å of sputter deposited tantalum which also serves as an interconnection interface. The wafer is then covered with 100 Å of chromium silicide by sputter deposition which is to be used as an etch stop, and then by 1500 Å of silicon nitride again by sputter deposition. A first mask delineates the multilayer structures being chosen to serve as resistors $R_1$ and $R_2$ on the basis of using a reactive ion etching step to etch through this last deposited silicon nitride to the chromium silicide, serving as indicated as an etch stop, in those locations in which structures for such resistors are not to be present. Then an ion mill is used to cut through the chromium silicide, the tantalum and the multilayer, with about 300 Å overreach to insure complete etching, to thus form the structures for these resistors with the tantalum remanent thereon as interconnection interface 13'. There will also be a chromium silicide layer thereon, and some silicon nitride residue over this chromium silicide layer remaining on the protected resistor structures.

The wafer is then covered with a further 1500 Å of silicon nitride through sputter deposition, and a second mask with another reactive ion etching step opens contact vias to the chromium silicide and tantalum layers of the multilayer resistor structures for electrically interconnecting these structures (and to interconnection provisions made for interconnections to the circuits in the integrated circuit therebelow in semiconductor wafer 10). There will be left a chromium silicide layer, 31, on the structures with some remanent portion thereof in the vias, on which will reside a silicon nitride remanent, 32, about the vias including the previous silicon nitride residue, 32'. A 5000 Å thick aluminum film alloyed with 2% copper is then sputter-deposited on the resulting construct, and this film is etched using a third mask layer to leave it in electrical contact with the resistor structures through the vias and to leave it providing the desired electrical interconnection arrangement for the device, as shown in FIG. 9A. This etching again accomplished by a wet chemical etching step to result in this interconnection arrangement, 33.

A further layer of 10,000 Å of silicon nitride, 34, is then sputtered onto this interconnection result. This last provided silicon nitride layer is to serve as the base for concentrator-shield 30A and shield 30B to be provided by a thick (0.5 mil) permalloy material plated thereon. Such plating begins with a 1000 Å plating seed film of permalloy which is sputtered onto this silicon nitride base. This initially plated result is then coated with a thick layer of photoresist which is exposed and developed to define the regions where the main portions of concentrator-shield 30A and concentrator 30B are to be plated. This is followed by chemically plating a 4 μm thick layer of gold on the exposed portions of the permalloy seed plating. The gold improves adhesion of the main portions to be provided. Such main portions are then chemically plated onto the exposed gold to a thickness of 12.5 μm to provide concentrator-shield 30A in FIG. 9B.

The developed photoresist is then removed, and the resulting construct is then dipped into a bath formed of a mixture of phosphoric, ascetic and nitric acids to remove the 1000 Å permalloy seed layer from all areas not under either concentrator-shield 30A or concentrator 30B. A final mask then defines bonding pads to be provided, and vias therefor to interconnection arrangement 33 are provided using this mask and a reactive ion etching step. This last etching step can be preceded by a further sputter deposition of silicon nitride for protective purposes if desired providing the layer shown in dashed lines and designated 35 in FIG. 9B. The wafer after such provision of bonding pad vias is then ready for wafer probe, dicing, and packaging.

The devices resulting from such a fabrication process have provided shielding to the resistors $R_2$ sufficient to reduce the magnetic field occurring therein by around 95% over the ambient field. In addition, the resistors $R_1$ have had the field occurring therein concentrated by a factor of 5 so that they are in a field of a value some 5 times that of the ambient field. Thus, the device of FIGS. 9A and 9B is an effective sensor of magnetic field components aligned along the axis passing through concentrator-shield 30A and concentrator 30B and the gap therebetween.

The structural arrangement of FIG. 9A must have concentrator-shield 30 therein, provided over resistors $R_2$, with sufficient dimensions as indicated above to result in it having a saturation demagnetizing field that is greater than the expected maximum externally magnetic applied field if the permeable material mass forming same is to be sufficient to shield those resistors from being significantly affected by such externally applied fields. Of course, simultaneously with such effective shielding that mass must aid in providing the desired concentrating of externally applied magnetic fields. Permeable material masses of relatively large length in the direction of the externally applied fields provide substantial concentration and shielding but saturate in relatively small externally applied fields, as indicated above. On the other hand as also indicated, such masses which are relatively short in that direction will not saturate until substantially higher applied field values are reached but will not provide satisfactory shielding or concentration. In many instances a satisfactory design can be achieved by increasing the thickness dimension of the permeable material mass while choosing an adequate length dimension as set out above.

However, in a significant number of situations, the ability to form such permeable material masses appropriately sized on an integrated circuit chip to provide the assurance that they will not saturate in externally applied magnetic fields of the expected maximum value while providing sufficient shielding and concentration may be lacking. This situation would typically come about because of the fabrication process constraints or economic constraints, or both, that must also be satisfied. In such situations, an alternative permeable material mass arrangement can be used as is shown in FIG. 11 which will result in both sufficient shielding and concentration while avoiding saturation as low applied fields, and can accomplish this result using masses of acceptable dimensions on an integrated circuit chip.

Figure 11:
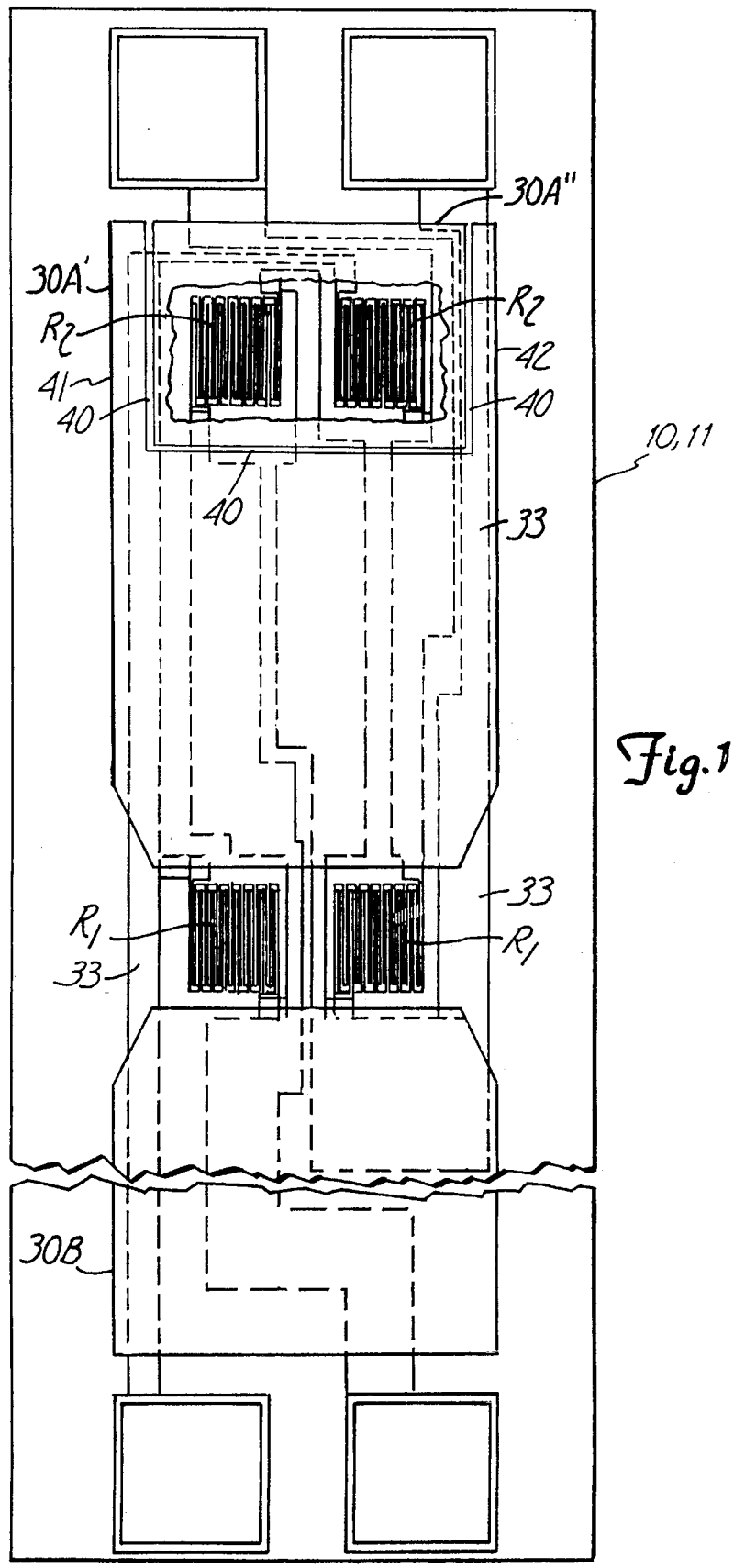
FIG. 11 is a diagrammatic representation of an alternate device embodying the present invention.

There in FIG. 11, concentrator-shield 30A of FIG. 9A has had the permeable material mass forming it split into two portions including a concentrator portion, 30A', and a shield portion, 30A". Permeable material masses 30A' and 30A" are separated by a gap, 40, which has a shape somewhat like that of a "U", i.e. like that of a portion of a rectangle with one of the shortest sides thereof missing. As a result, concentrator permeable material mass 30A'extends from the gap separating concentrator 30A' from concentrator 30B, at which gap resistors $R_1$ are located, back toward shield permeable material mass 30A" provided over resistors $R_2$ to partially surround that shield as can be seen in FIG. 11. That is, although the bulk of concentrator 30A' is provided between shield 30A" and the gap between concentrators at which resistors $R_1$ are provided, extension portions, 41 and 42, of concentrator 30A' extend further back past that edge of shield 30A" closest to resistors $R_1$ to be positioned along either side of shield 30A" to contain that shield between them.

This configuration results in the permeable material mass for shield 30A" having a much shorter dimension of extent along an axis passing through concentrators 30A' and 30B, including through the gap therebetween, and extending further across gap 40 through shield 30A". As a result, there is a much larger demagnetizing field present in shield 30A" along that axis in response to an externally applied field therealong resulting in a smaller net field therein compared to the net field resulting in shield-concentrator 30A of FIG. 9A from the same value of externally applied field. Thus, a considerably larger external field will be required to saturate shield 30A" in the structure of FIG. 11 than would have been required to saturate shield-concentrator 30A in the structure of FIG. 9A.

On the other hand, there will be some reduction in the magnetic field to which resistors $R_1$ in the gap between concentrators 30A' and 30B is subject as the effective length of the concentrating permeable material mass is reduced. This is offset in part by the presence of extensions 41 and 42 of concentrator 30A' on either side of shield 30A" which tend to serve as flux guides around both shield 30A" and resistors $R_2$ positioned therebelow. Thus, the reduction in concentration will not be too great, and will thus result in acceptable sensitivity for the sensor while allowing it to respond to greater externally applied fields without loss of the effective shielding of resistors $R_2$ from that field.

Although the present invention has been described with reference to preferred embodiments, workers skilled in the art will recognize that changes may be made in form and detail without departing from the spirit and scope of the invention.

What is claimed is:

1. A magnetic field sensor comprising:

a substrate having a major surface portion;

a pair of magnetoresistive thin-film layered structures provided on said substrate electrically connected to one another and with each also being electrically connected to an interconnection means suited for electrical connection to a source of electrical energy; and a group comprising three permeable material masses provided on said substrate with one of said two layered structures being positioned adjacent a first gap between a first and second of said permeable material masses in said group thereof, and with that layered structure remaining positioned (a) adjacent a side of a third of said permeable material masses in said group thereof which side faces said substrate as supported thereon, but (b) spaced apart from said first gap and from a second gap between said second and third permeable masses in said group thereof in a direction at least in part paralleling an axis substantially parallel to said substrate passing through both of said second and third permeable material masses and said second gap.

2. The apparatus of claim 1 wherein said second gap follows a plurality of directions along its course as determined by boundaries of said second and third permeable material masses.

3. The apparatus of claim 2 wherein said second permeable material mass at least partially surrounds said third permeable material mass.

4. The apparatus of claim 1 wherein said layered structures are first and second structures each comprising a succession of layers including a magnetoresistive, anisotropic, first ferromagnetic thin-film provided on said substrate major surface portion; an intermediate layer provided on said first ferromagnetic thin-film with a thickness of less than 50 Å, said intermediate layer being formed of a substantially non-magnetic, conductive alloy having two substantially mutually immiscible components therein and a third component therein at least partially immiscible with each of those first two components; and a magnetoresistive, anisotropic, second ferromagnetic thin-film provided on said intermediate layer.

5. The apparatus of claim 4 wherein said layered structures are electrically connected in a bridge circuit.

6. The apparatus of claim 1 wherein said layered structures are first and second structures each comprising a succession of layers including a magnetoresistive, anisotropic, first ferromagnetic thin-film provided on said substrate major surface portion; an intermediate layer provided on said first ferromagnetic thin-film with a thickness of less than 50 Å, said intermediate layer being formed of a substantially non-magnetic, conductive alloy having copper, silver and gold components therein; and a magnetoresistive, anisotropic, second ferromagnetic thin-film provided on said intermediate layer.

7. A magnetic field sensor comprising:

a substrate having a major surface portion;

a pair of magnetoresistive thin-film layered structures provided on said substrate electrically connected to one another and with each also being electrically connected to an interconnection means suited for electrical connection to a source of electrical energy, said pair of magnetoresistive thin-film layered structures comprising magnetoresistive, anisotropic, first and second ferromagnetic thin-films separated by the intermediate layer having a thickness of less than 30 Å and formed of a substantially non-magnetic conductive alloy having two substantially immiscible components therein; and a pair of permeable material masses provided on said substrate with one of said two layered structures being positioned in a gap therebetween, and with that one remaining positioned near a side of one of said permeable material masses between surface locations thereon intersected by an axis substantially parallel to said substrate passing through both said permeable masses and said gap.

8. The apparatus of claim 7 wherein said two substantially immiscible components are copper and silver.

9. The apparatus of claim 7 wherein said two substantially immiscible components are copper and gold.

10. The apparatus of claim 7 wherein there is a third permeable material mass positioned in said gap to thereby form a pair of subgaps so that said layered structure positioned in said gap is also positioned in a first of said pair of subgaps located between said third permeable material mass and one of said pair of permeable material masses with a second of said pair of subgaps positioned between said third permeable material mass and that remaining one of said pair of permeable material masses.

11. The apparatus of claim 10 wherein said two substantially immiscible components are copper and silver.

12. The apparatus of claim 10 wherein said two substantially immiscible components are copper and gold.

13. A magnetic field sensor comprising:

a substrate having a major surface portion;

a pair of magnetoresistive thin-film layered structures provided on said substrate electrically connected to one another and with each also being electrically connected to an interconnection means suited for electrical connection to a source of electrical energy, said pair of magnetoresistive thin-film layered structures comprising magnetoresistive, anisotropic, first and second ferromagnetic thin-films provided on said substrate major surface portion separated by an intermediate layer with a thickness of less than 30 Å and formed of a substantially non-magnetic, conductive alloy having copper and silver components therein; and a pair of permeable material masses provided on said substrate with one of said two layered structures being positioned in a gap therebetween, and with that one remaining positioned near a side of one of said permeable material masses between surface locations thereon intersected by an axis substantially parallel to said substrate passing through both said permeable material masses and said gap.

14. The apparatus of claim 13 wherein there is a third permeable material mass positioned in said gap to thereby form a pair of subgaps so that said layered structure positioned in said gap is also positioned in a first of said pair of subgaps located between said third permeable material mass and one of said pair of permeable material masses with a second of said pair of subgaps positioned between said third permeable material mass and that remaining one of said pair of permeable material masses.

15. A magnetic field sensor comprising:

a substrate having a major surface portion;

a pair of magnetoresistive thin-film layered structures provided on said substrate electrically connected to one another and with each also being electrically connected to an interconnection means suited for electrical connection to a source of electrical energy, said pair of magnetoresistive thin-film layered structures comprising magnetoresistive, anisotropic, first and second ferromagnetic thin-films provided on said substrate major surface portion separated by an intermediate layer with a thickness of less than 30 Å and formed of a substantially non-magnetic, conductive alloy having copper and gold components therein; and a pair of permeable material masses provided on said substrate with one of said two layered structures being positioned in a gap therebetween, and with that one remaining positioned near a side of one of said permeable material masses between surface locations thereon intersected by an axis substantially parallel to said substrate passing through both said permeable material masses and said gap.

16. The apparatus of claim 15 wherein there is a third permeable material mass positioned in said gap to thereby form a pair of subgaps so that said layered structure positioned in said gap is also positioned in a first of said pair of subgaps located between said third permeable material mass and one of said pair of permeable material masses with a second of said pair of subgaps positioned between said third permeable material mass and that remaining one of said pair of permeable material masses.

\* \* \* \* \*

UNITED STATES PATENT AND TRADEMARK OFFICE
CERTIFICATE OF CORRECTION

PATENT NO. : 5,617,071

DATED : APRIL 1, 1997

INVENTOR(S) : JAMES M. DAUGHTON

It is certified that error appears in the above-indentified patent and that said Letters Patent is hereby corrected as shown below:

Col. 3, line 29, delete "establisltment", insert --establishment--

Col. 6, line 10, delete "nomnagnetic", insert --nonmagnetic--

Col. 9, line 26, delete "sorter", insert --softer--

Col. 12, line 61, delete "timer", insert --further--

Col. 13, line 11, delete "water", insert --wafer--

Col. 13, line 26, delete "or", insert --of--

Col. 17, line 62, delete "front", insert --from--

Col. 22, lines 53 and 54, delete "responsive", insert --reasonable--

Col. 22, line 55, delete "shied", insert --shield--

Col. 22, line 58, delete "shove", insert --above--

Signed and Sealed this

Twenty-third Day of September, 1997

Attest:

BRUCE LEHMAN

*Attesting Officer*

*Commissioner of Patents and Trademarks*